(12) United States Patent
O'Connor et al.

(10) Patent No.: US 6,234,321 B1
(45) Date of Patent: May 22, 2001

(54) AUTOMATIC SEMICONDUCTOR PART HANDLER

(75) Inventors: R. Bruce O'Connor, Clare (IE); Zinovy Alshine, Brookline, MA (US)

(73) Assignee: Aseco Corporation, Marlborough, MA (US)

( * ) Notice: Subject to any disclaimer, the term of this patent is extended or adjusted under 35 U.S.C. 154(b) by 0 days.

(21) Appl. No.: 09/535,869

(22) Filed: Mar. 27, 2000

Related U.S. Application Data

(62) Division of application No. 08/678,426, filed on Jul. 31, 1996, now Pat. No. 6,112,905.

(51) Int. Cl.$^7$ .................................................. B07G 5/02
(52) U.S. Cl. ..................... 209/539; 209/573; 198/246.2; 198/432
(58) Field of Search ................................. 209/539, 540, 209/573, 923; 198/346.2, 432

(56) References Cited

U.S. PATENT DOCUMENTS

| | | | |
|---|---|---|---|
| 5,848,705 | * 12/1998 | Gianpaolo et al. | 209/573 X |
| 5,967,293 | * 10/1999 | Gaines | 198/432 X |
| 6,046,421 | * 4/2000 | Ho | 209/573 |
| 6,053,301 | * 4/2000 | Kamei | 198/432 X |
| 6,105,750 | * 8/2000 | Belvederi | 198/432 |
| 6,112,905 | * 9/2000 | O'Connor et al. | 209/539 |

* cited by examiner

Primary Examiner—David H. Bollinger
(74) Attorney, Agent, or Firm—Choate, Hall & Stewart

(57) ABSTRACT

Automatic semiconductor part handler. In one aspect the handler includes a source of parts and a transfer mechanism for transferring a part from the source to a belt assembly. The belt assembly includes a belt, a belt displacement controller, and an image forming device for forming an image of the part with respect to a desired end point. The belt displacement controller is coupled to the belt to move the belt based upon the image of the part with respect to the desired end point, thereby positioning the part in a precise location with respect to the direction of motion of the input belt.

11 Claims, 20 Drawing Sheets

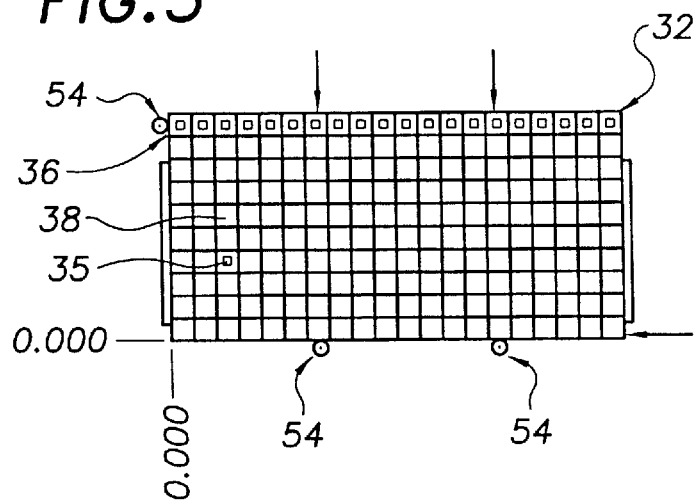
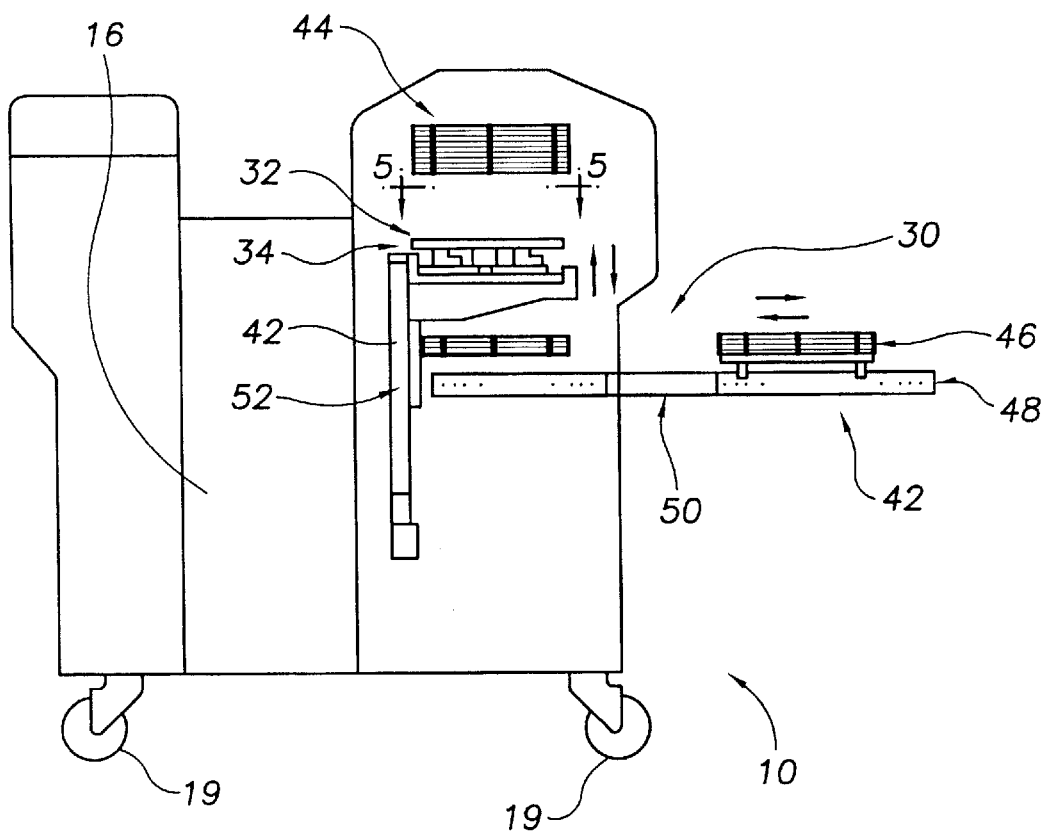

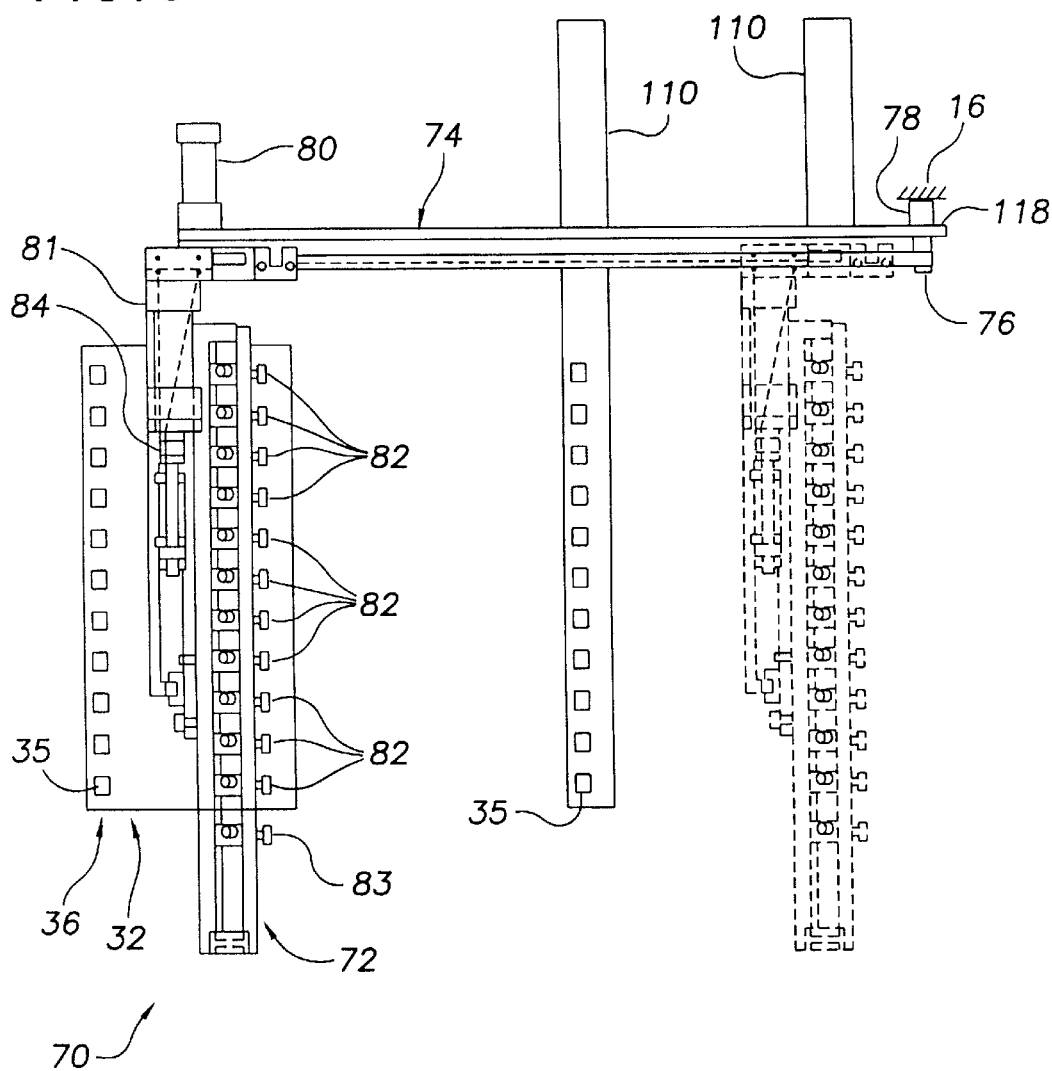

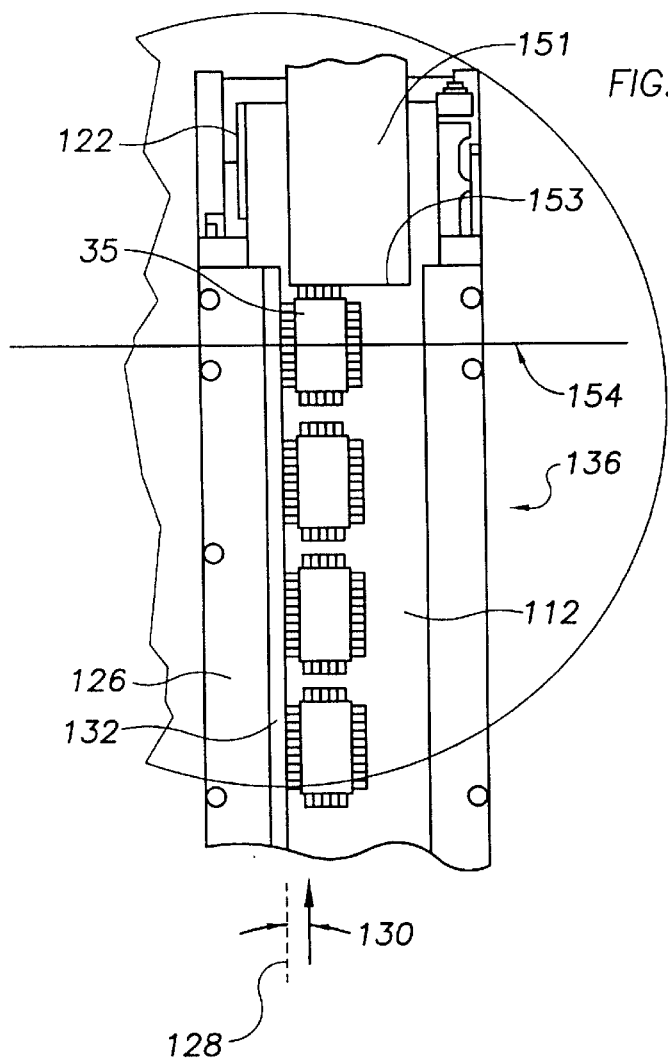
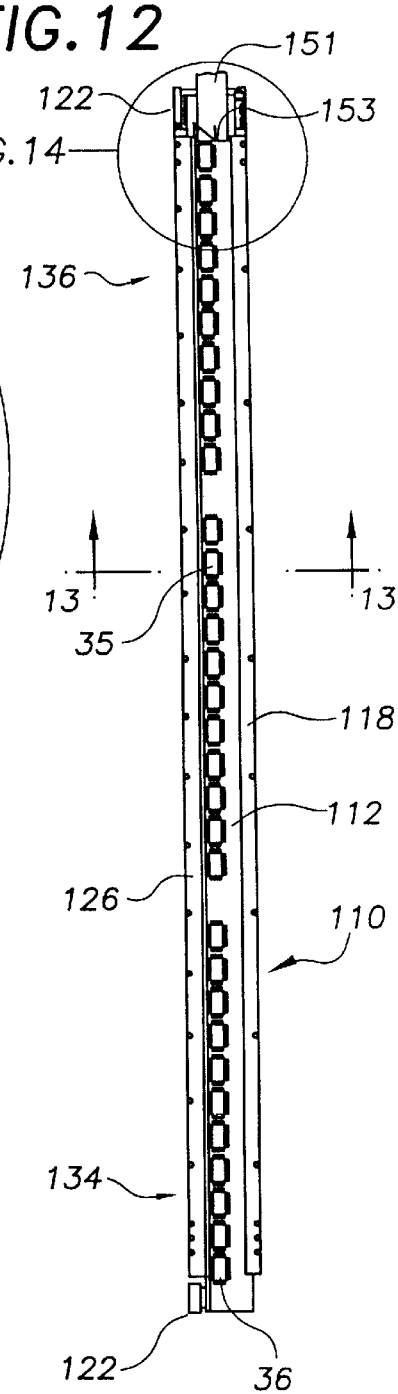
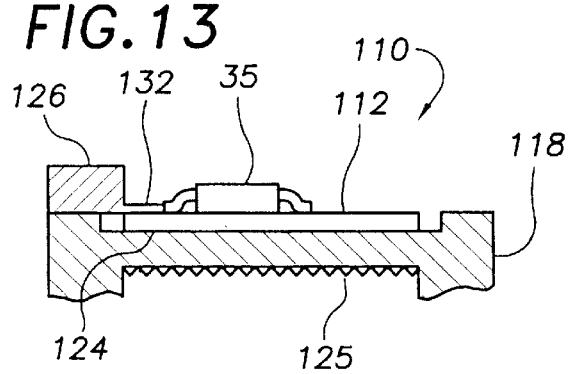

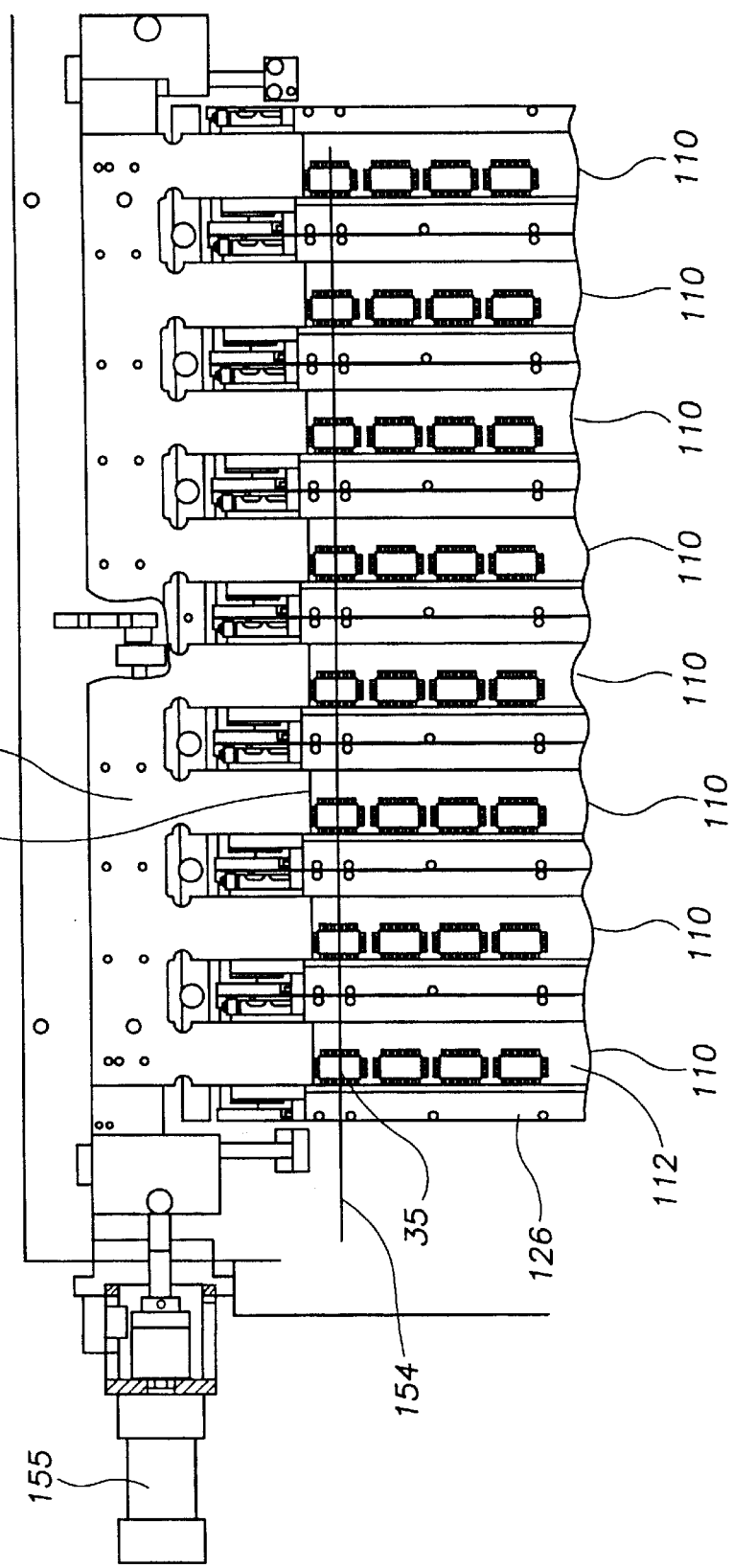

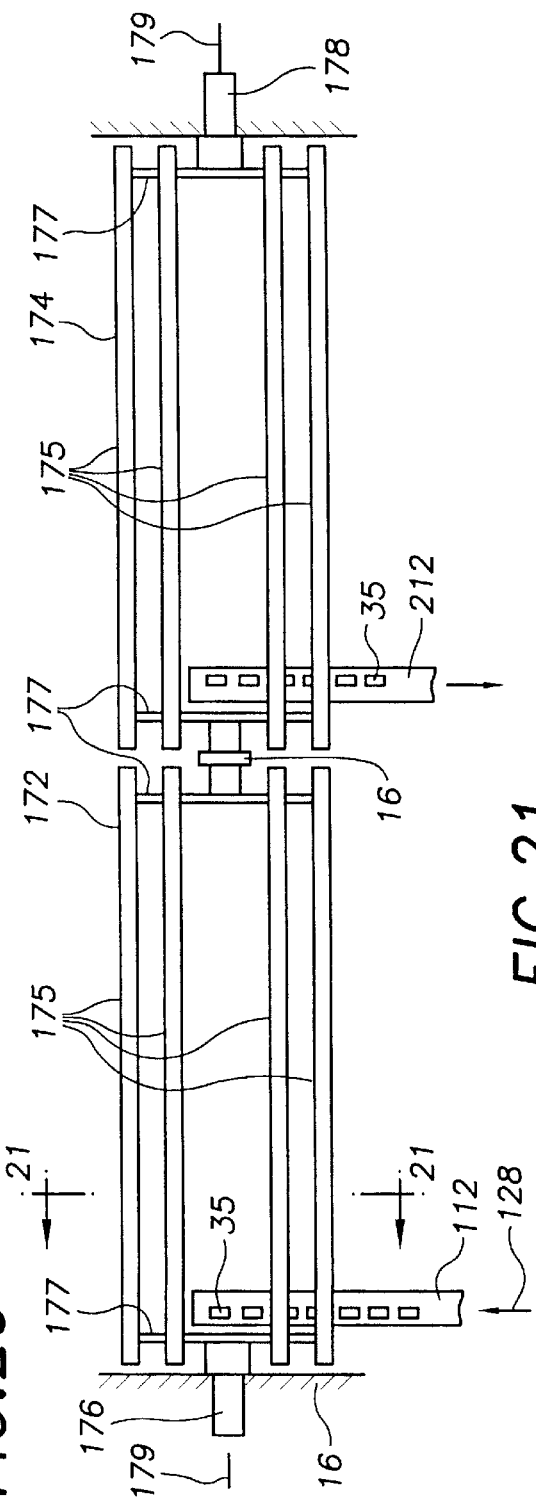

AUTOMATIC SEMICONDUCTOR PART HANDLER

This application claims the priority of and is a divisional of U.S. patent application Ser. No. 08/678,426, filed Jul. 31, 1996 is now U.S. Pat. No. 6,112,905, the entire contents of which are incorporated herein by reference.

FIELD OF THE INVENTION

The present invention relates generally to semiconductor part fabrication and testing, and more particularly to an automatic high-throughput handling method and apparatus for precisely orientating semiconductor parts for engagement with a test contactor.

BACKGROUND OF THE INVENTION

In the electronics industry, there is an ever increasing demand for semiconductor parts such as integrated circuit chips, semiconductor devices, transistors, diodes, hybrid circuits, and the like (hereinafter parts), to be produced less expensively and with smaller dimensions. Manufacture of these parts is not perfect electrically or mechanically. Although defects in some families of parts are quite rare, the complexity of the part and the consequence of failure usually dictate that the parts meet a high standard of quality. In other words, every part or, in some cases, at least a sample of the parts must undergo an electrical test and/or a mechanical inspection. Ordinarily, a very large quantity of identical parts are tested and inspected. This testing and inspection step can be a significant bottleneck in electronic part manufacture. One way to increase manufacturing productivity of such electronic parts, and thereby reduce the per unit cost, is to increase the speed and accuracy of the testing and inspection of the parts.

To improve testing efficiency, an automatic part handler delivers and removes the parts from the electrical test equipment. The electrical test of the parts measures certain electrical characteristics to ascertain the quality of the part. The electrical test is accomplished via a testing contactor which engages the leads of the particular part. In some cases, part testing is performed at a temperature other than ambient temperature to further measure certain operating characteristics. To improve efficiency and accuracy, parts are supplied to and removed from the testing contactor(s) by an automatic part handler which often contains a temperature conditioning means.

A significant cost and efficiency consideration for all part handlers is alignment between the part to be tested and the testing contactor. Precise alignment is necessary to insure proper electrical contact. As parts evolve into smaller packages with more leads, alignment between the part and the test contactor must be even more precise. For example, because part lead widths are now on the order of 0.010 inches and lead pitches are on the order of 0.020 inches, even "small" x, y and theta alignment errors will result in an unsuccessful electrical test. Repeatability of these precise alignment requirements is essential because thousands of very nearly identical parts must accurately and electrically engage the testing contactor.

In the part handler field, most of the prior art precisely aligns parts by using changeover kits or part holders. See, for example, U.S. Pat. No. 5,290,134 to Baba and U.S. Pat. No. 5,148,100 to Sekiba. A changeover kit mechanically configures the handler to adjust all part handling mechanisms, thermal storage systems, contactors, and other portions of the handler to run a particular part. The most expensive portion of a changeover kit are part carriers (also called precising pockets). A part carrier, as part of a changeover kit, typically houses at least one part in a machined pocket that has tapered sides so as to receive and precisely locate a part. The part carrier repeatedly orients a part by maintaining very tight tolerances tailored to the dimensions of the type of part to be tested. The part carriers are closely machined, usually from aluminum or engineering plastic, and are easily damaged and must be carefully maintained.

Changeover kits, and more particularly part carriers, have numerous limitations. First, because the carrier recess must be tightly machined to provide precise orientation, parts with out-of-spec dimensions present serious problems. A part that is slightly too large will often become jammed in the carrier. To fix a jam, an operator must attend to the handler and oftentimes the handler must be shut down. A part that is too small will be loose and become misaligned at the contactor interface. Damage to the contactor can result from inserting misaligned parts. Second, every part having different dimensions requires a different changeover kit, which includes corresponding part carriers. Therefore, because there are hundreds of different part types hundreds of changeover kits are required. Production control and maintenance of so many changeover kits becomes a time-consuming and costly endeavor. Third, changeover kits are expensive. On large full-production handlers, each changeover kit can cost between ten and thirty-five thousand dollars.

In addition to the problems in the prior art described above, the mass of the part carriers further hinders the efficiency of the handler. Relative to a part, the part carrier's mass is tremendous. The additional mass of the part carriers slows the various transport mechanisms and can impart damaging forces and vibration into the process during acceleration and deceleration. The part carrier mass also slows thermal conditioning of the parts.

Another shortcoming in the handler prior art is the lack of integrated lead and dimensional inspection. The manufacturing process usually includes a visual inspection of the part, including the part leads and pin #1 orientation. In the prior art, this manufacturing step is often performed separately from the electrical testing step. An additional concern is that parts are occasionally damaged during electrical testing by the handler or testing contactor itself. For efficient part manufacture, it is vital that part leads be inspected before, during and after electrical test handling.

Yet another problem of handlers in the prior art is their large bulk and footprint. Factory floor space can be considerable. Handlers are often removed off the factory floor for maintenance and repair. The smaller the handler, the easier it is to relocate and repair the machine.

It appears that vision-based systems are not employed in the automatic part handling field. However, machine vision methods and apparatus are found in other fields including the circuit board manufacturing prior art. The most common vision-based apparatus in circuit board manufacturing is called "pick and place." The basic pick and place apparatus uses a placement arm, a camera and vision software. The placement arm picks up a part and brings it to a zeroing position where it is observed by the camera. The vision software calculates the x, y and theta corrections necessary to place the part at the desired location. The placement arm makes the corrections dictated by the vision software and places the part accordingly. A somewhat similar apparatus, but used for part testing purposes, is described in U.S. Pat. No. 5,481,202 to Frye. Frye discloses a vision-based system which aligns a part with an electrical testing apparatus exclusively by visual means. By relying exclusively on visual alignment means, however, part testing is slow and cumbersome. More importantly, like the automatic handler prior art described above Frye requires a part carrier to accurately orient the part.

It is therefore a general object of the present invention to improve the efficiency, part alignment, part throughput, and cost-effectiveness of automatic part handlers.

It is a specific object of the present invention to provide a handler which eliminates the need for part carriers.

It is yet another specific object of the present invention to employ machine vision to improve part alignment, part inspection and handler throughput.

It is still another specific object of the present invention to provide parallel paths to increase the handler throughput.

SUMMARY OF THE INVENTION

The present invention favorably addresses the above described limitations. The present invention provides an automatic semiconductor part handler apparatus and method that is particularly well-suited for use with multiple test contactors, the handler providing high throughput at low cost. The handler comprises an input gantry which transfers a plurality of parts from a standard input tray to an input belt assembly, the input belt assembly moves the parts towards a trolley assembly while biasing the parts against a precisor rail. The input belt motion is controlled by an input belt motor which interfaces with an imaging system and a computer system. The imaging system views the parts on the input belt and communicates vision data to the computer system. The computer directs the input belt motor to move the input belt such that the first part in line is stopped by an adjustable end stop. The combination of the precisor rail and the adjustable end stop provides a repeatable and precise orientation of each part. The handler comprises a plurality of input belts operating and orientating a plurality of parts in parallel. Once the plurality of parts are oriented at the adjustable end stop, the trolley assembly transfers the parts to a test contactor. After testing, the trolley transfers the parts to an output belt assembly. The output belt assembly includes similar precise and repeatable orientation capability as the input belt assembly. After the parts are oriented on the output belt assembly, an output sorter transfers the parts from the output belt assembly to standard output trays. Placement within the output trays is based upon the test results of the particular part.

In another embodiment, the imaging system further observes the interface between the parts and the test contactor and inspects the parts for mechanical characteristics.

In yet another embodiment, the handler includes a thermal conditioning means so as to test the parts at temperatures other than room temperature. The thermal conditioning means includes input and output conditioning.

BRIEF DESCRIPTION OF THE DRAWINGS

FIG. 2a is a top view of the handler.

FIG. 4 is a side cutaway view of the handler showing a side view of an input tray handler.

FIG. 5 is a top view of a working area input tray contained in the input tray handler.

FIG. 6 is a top view of an input gantry over the working area input tray and two input belt assemblies.

FIG. 12 is a top view of the input belt assembly.

FIG. 13 is a sectional view of the input belt assembly.

FIG. 14 is a detailed top view of the input belt assembly.

FIG. 15 is a top view of eight input belt assemblies operating in parallel with an adjustable end stop.

FIG. 20 is a top view of two drums of the trolley assembly including one input belt assembly and one output belt assembly.

FIG. 21 is a side cutaway view of the trolley assembly.

DESCRIPTION OF THE PREFERRED EMBODIMENT

Figure 1:
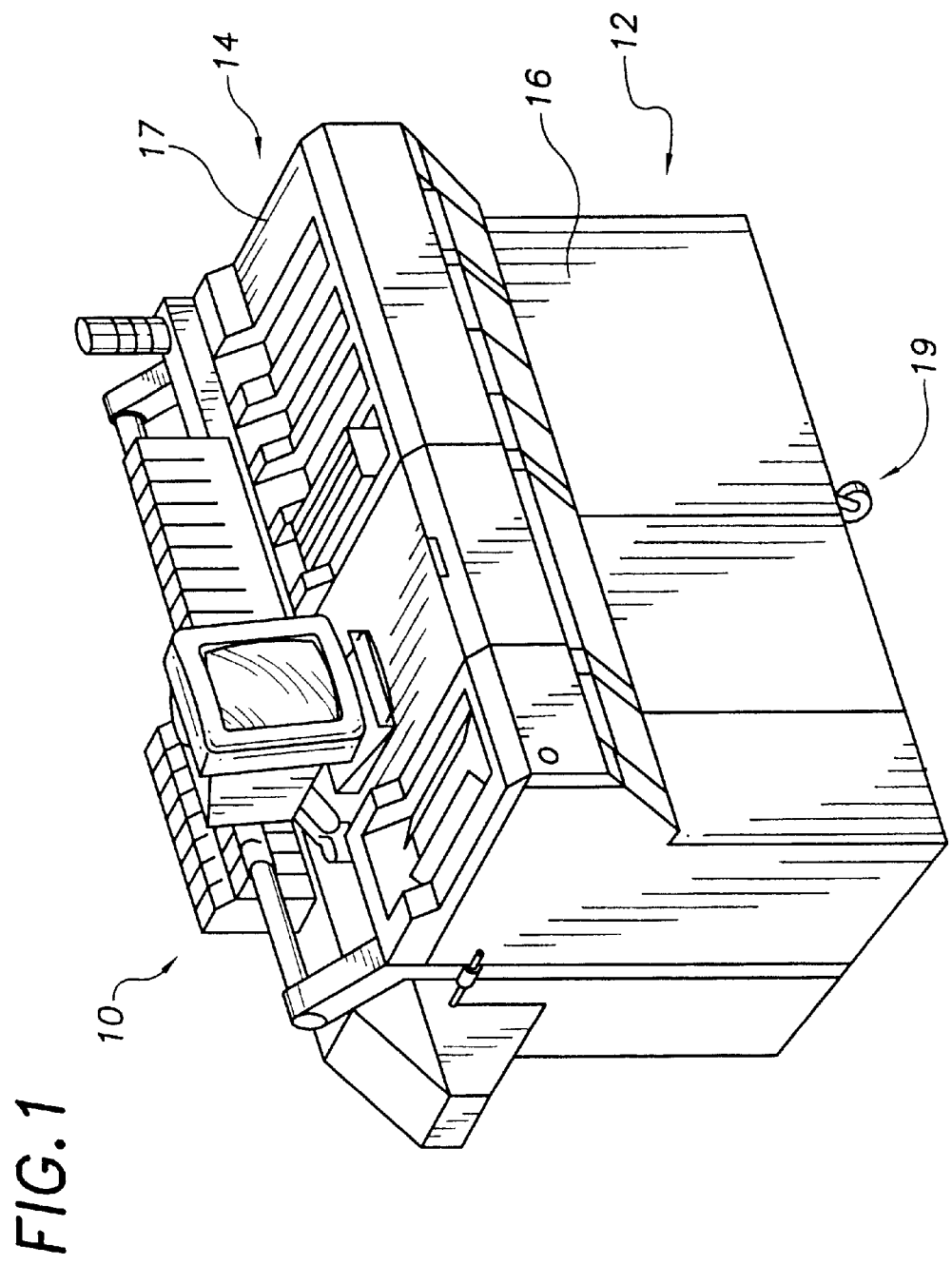
FIG. 1 is a perspective view of an automatic parts handler according to the present invention.

An automatic part handler 10 in accordance with the preferred embodiment of the present invention is shown generally in FIG. 1. The handler 10 is comprised of a support portion 12 and a handling portion 14. The support portion 12 includes a chassis 16 which contains power supply components, electric connections and cables (not shown) which control the functionality and sequencing of the handling operation. The entire handler 10 is within the floor area defined by the chassis 16 except for a computer control system 18 which may be located remote to the chassis. A shroud 17 encases the handler 10 to protect the parts from the environment. To ease maneuverability of the handler 10, the chassis 16 is elevated off the floor by wheels 19. As seen in the top view of FIG. 2a, the handler 10 is adjacent to a test contactor 6 of a test station 8.

Figure 2:
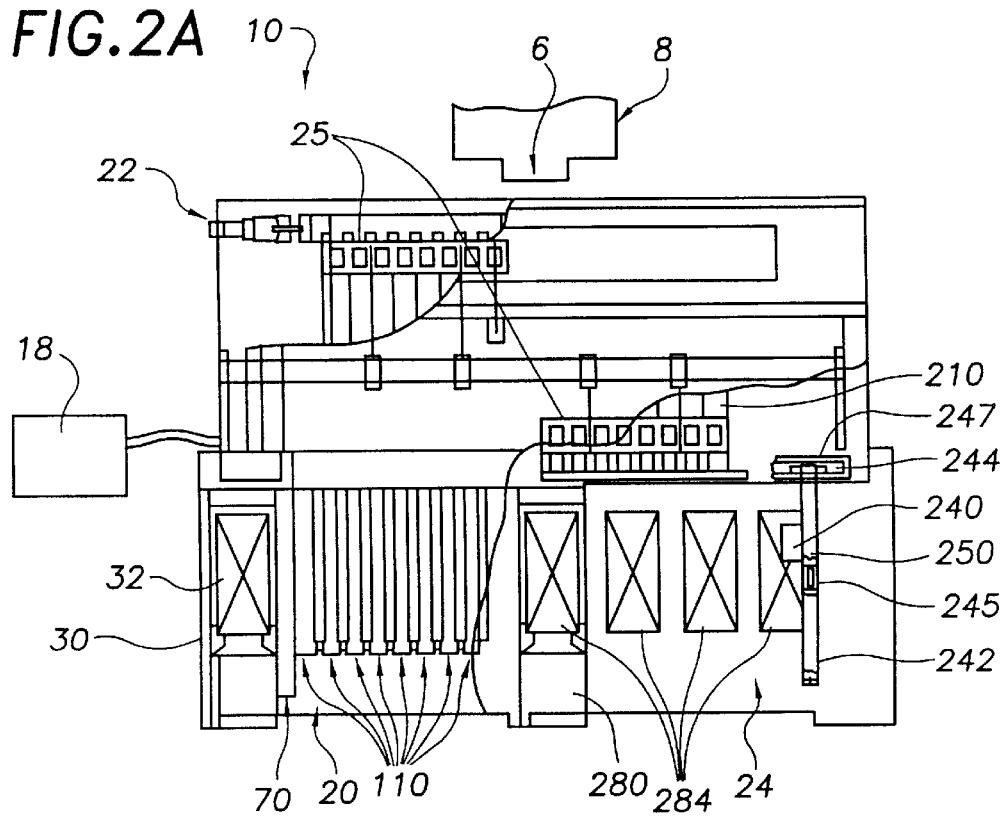
FIG. 2 is a front view of the automatic parts handler.
Figure 3:
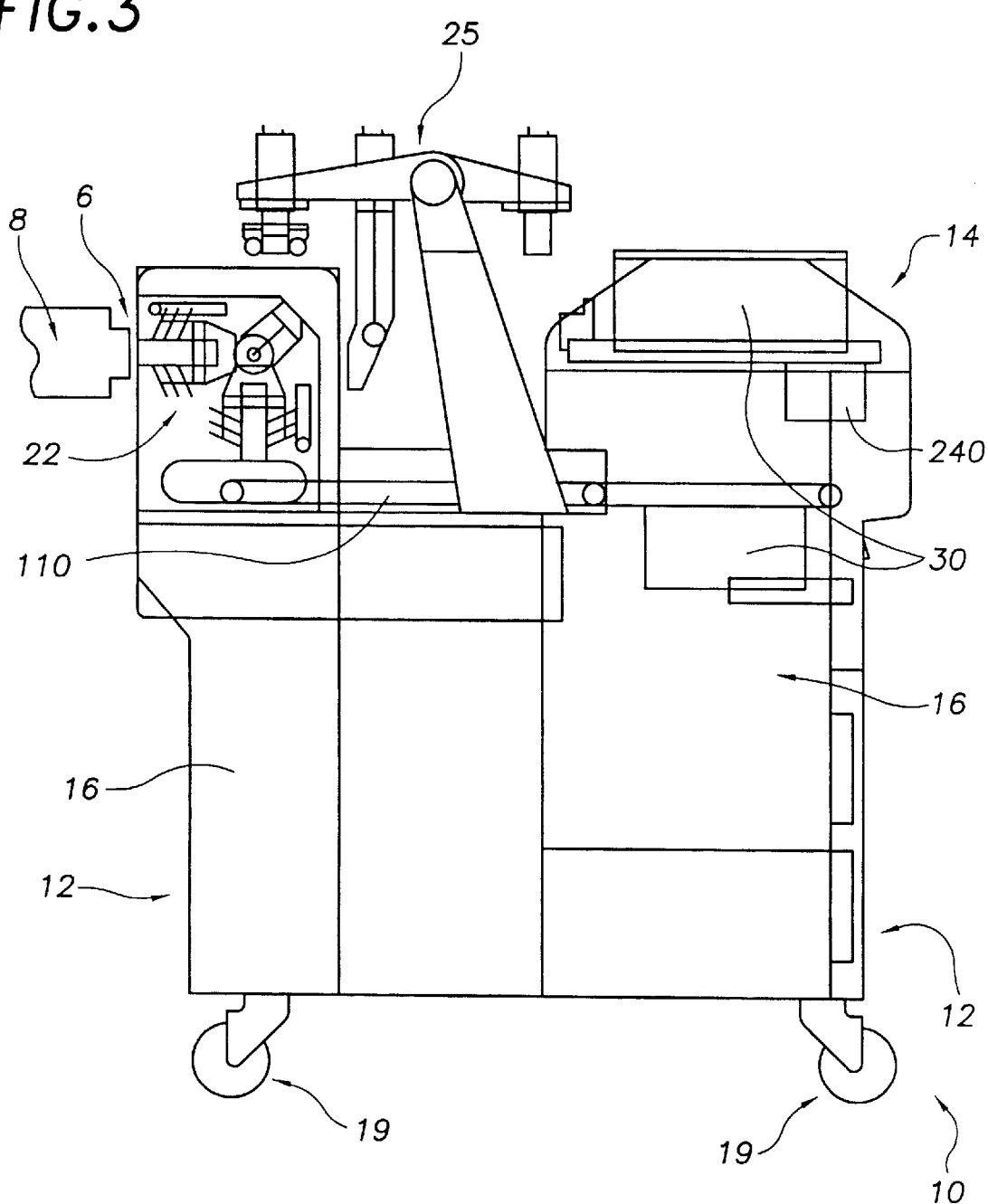
FIG. 3 is a side view of the handler.

The handling operation occurs primarily in the handling portion 14 of the handler 10. As shown in FIGS. 2, 2a and 3, the handling portion 14 includes an input side 20, a trolley assembly 22, an output side 24 and a vision system 25. The input side 20 delivers parts to the trolley assembly 22. The trolley assembly 22 transfers parts from the input side 20 to the test contactor 6 of the test station 8, and then to the output side 24. The output side 24 moves the parts away from the trolley assembly 22. The vision system 25 provides alignment data and inspection data of parts within the handler 10.

Referring now to FIGS. 2a and 4, the input side 20 includes an automated tray handling mechanism 30, an input gantry 70, and input belt assemblies 110. The progression of parts through the input side 20 is as follows. An input tray 32 containing parts to be tested is delivered by the automated tray handling mechanism 30 to a working tray area 34. The input gantry 70 transfers successive columns of parts 36 (see input tray 32 as depicted in FIG. 5) from the input tray 32 to one of the input belt assemblies 110. Each input belt assembly 110 moves the parts towards the trolley assembly 22.

The tray handling mechanism 30, as depicted in FIG. 4, manages the input trays 32. The input trays 32 contain parts which are to be tested at the test contactor 6 (see FIG. 2a). The design of input tray 32 is preferably a standard manufacturer-supplied tray used in the semiconductor industry and is usually rectangular, having pockets 38 arranged in an array-like fashion as seen in FIG. 5. The pockets 38 are sized such that every part 35 within tolerance fits in pockets 38 without interference. A nominally sized part 35 within pocket 38 is free to move approximately ±0.010 inches. Typically, chamfers on the sides of the pockets provide additional positioning guidance within the pockets 38.

Turning back to FIG. 4, the tray handling mechanism 30 automatically and successively moves the trays 32 through three areas: a staging area 42, a working area 34, and an empty tray area 44. First, at the staging area 42, stacked trays 46 are placed onto a platform 48. The platform 48 is mounted on a pull-out drawer 50 which makes loading and unloading of the stacked trays 46 easy and allows for automated loading and unloading of the stacked trays 46. Once the stacked trays 46 are loaded onto the platform 48, the drawer 50 is pushed into the handling mechanism 30. The platform 48 engages a motor driven elevator 52 which moves the trays 46 upwards until the topmost tray 32 is in a working area 34. In the working area 34, the topmost tray 32 is positioned in the horizontal plane with hard stops 54 as depicted in FIG. 5. The hard stops 54 provide accurate and repeatable positioning of the tray 32. Finally, when the unloading of parts 35 in the topmost tray 32 is complete, the elevator 52 moves the topmost tray 32 to the empty tray area 44 as shown in FIG. 5.

Looking now to FIG. 6, the input gantry 70 includes an arm 72 and a track 74. The track 74 is mounted to the input side 20 of the chassis 16 with fasteners 76 and spacers 78. The track 74 is horizontal and runs perpendicular to the input belt assemblies 110. The arm 72 runs along the track 74 and extends out from the track 74 parallel to the input belt assemblies 110. Relative to the input belt assemblies 110, the arm 72 is directly above. The arm 72 moves along track 74 and the arm 72 is propelled by a gantry motor 80. The motor 80 is controlled by the computer system 18. The range of motion of the arm 72 along the track 74 is at least from the far side of input tray 32 to all the input belt assemblies 110.

Figure 7:
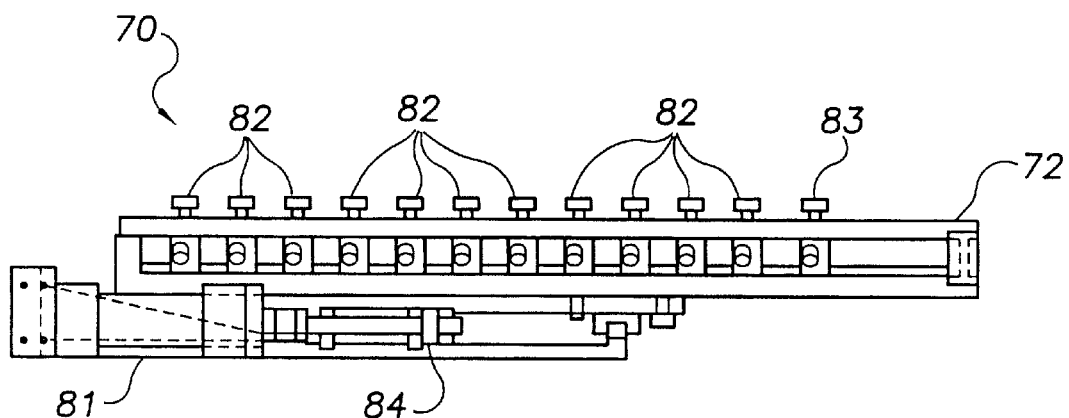
FIG. 7 is a top view of an arm of the input gantry.
Figure 8:
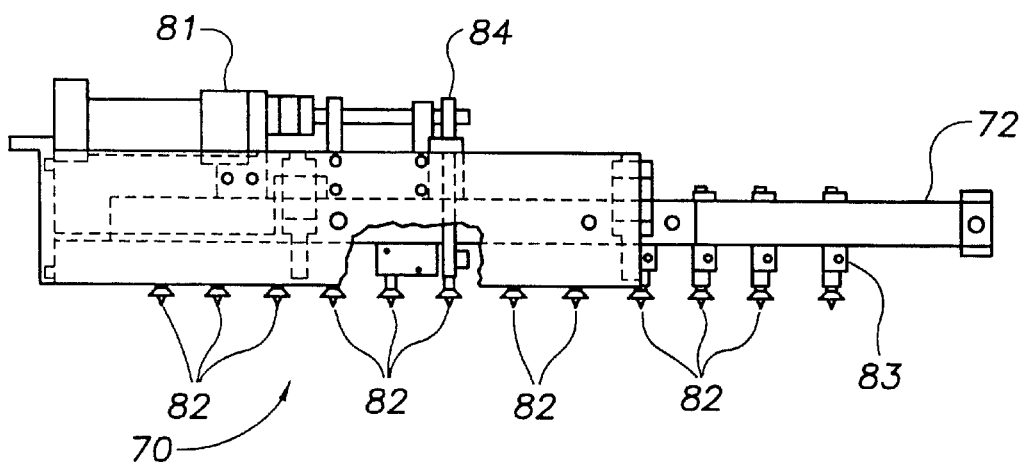
FIG. 8 is a side view of the arm of the input gantry.
Figure 9:
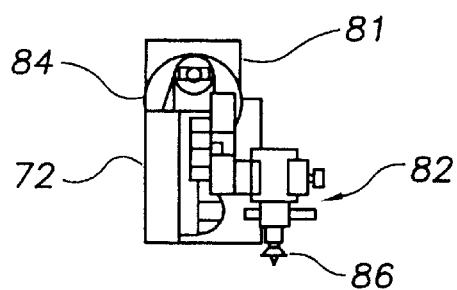
FIG. 9 is a front view of the gantry arm.

The input gantry 70 transfers parts 35, and can transfer an entire column of parts 36, from the tray 32 (in the working area 34) to one input belt assembly 110 (for clarity, only two input belt assemblies 110 are shown). To accomplish this task, the arm 72 of the input gantry 70 has a column of vacuum heads 82. The gantry motor 80 positions the arm 72 over the column of parts 36 desired to be transferred. The vacuum heads 82 are lowered in unison, by a hinge mechanism 84 in arm 72 operated by a hinge motor 81 (see also FIGS. 7, 8 and 9). Each vacuum head 82 generates a vacuum and applies the vacuum to its corresponding part 35. The entire column of parts 36 is picked up by the gantry 70 when the hinge mechanism 84 is raised. The arm 72 then moves along the track 74 until it is positioned over the desired input belt assembly 110. The vacuum heads 82 are lowered by the hinge mechanism 84, and vacuum is released thus placing the column of parts on the input belt assembly 110.

The pitch of the vacuum heads 82 corresponds to the pitch of the column of parts 36 within the input tray 32. The position of each vacuum head 82 along the arm 72 can be modified by an adjustment bar (not shown) so as to match the approximate pitch of the column of parts 36 within the tray 32. The pitch of the vacuum heads 82 needs to be adjusted only when the pitch of the parts within a tray 32 is changed. Therefore, the positioning of the vacuum heads 82 needs adjustment only when a different tray type is introduced into the handler 10. Unnecessary vacuum heads 83 can be disabled and moved to the end of the arm 72 or easily removed from the arm 72.

The vertical positioning of the vacuum heads 82 is pre-set by the hinge mechanism 84. Adjustability at the hinge 84 allows parts with different thicknesses to be picked up. Additionally, there is no need for an operator to adjust the settings because the computer system 18, in conjunction with sensors 88 (described below), can adjust the vertical pick-up position of the hinge mechanism 84 automatically.

Figure 10:
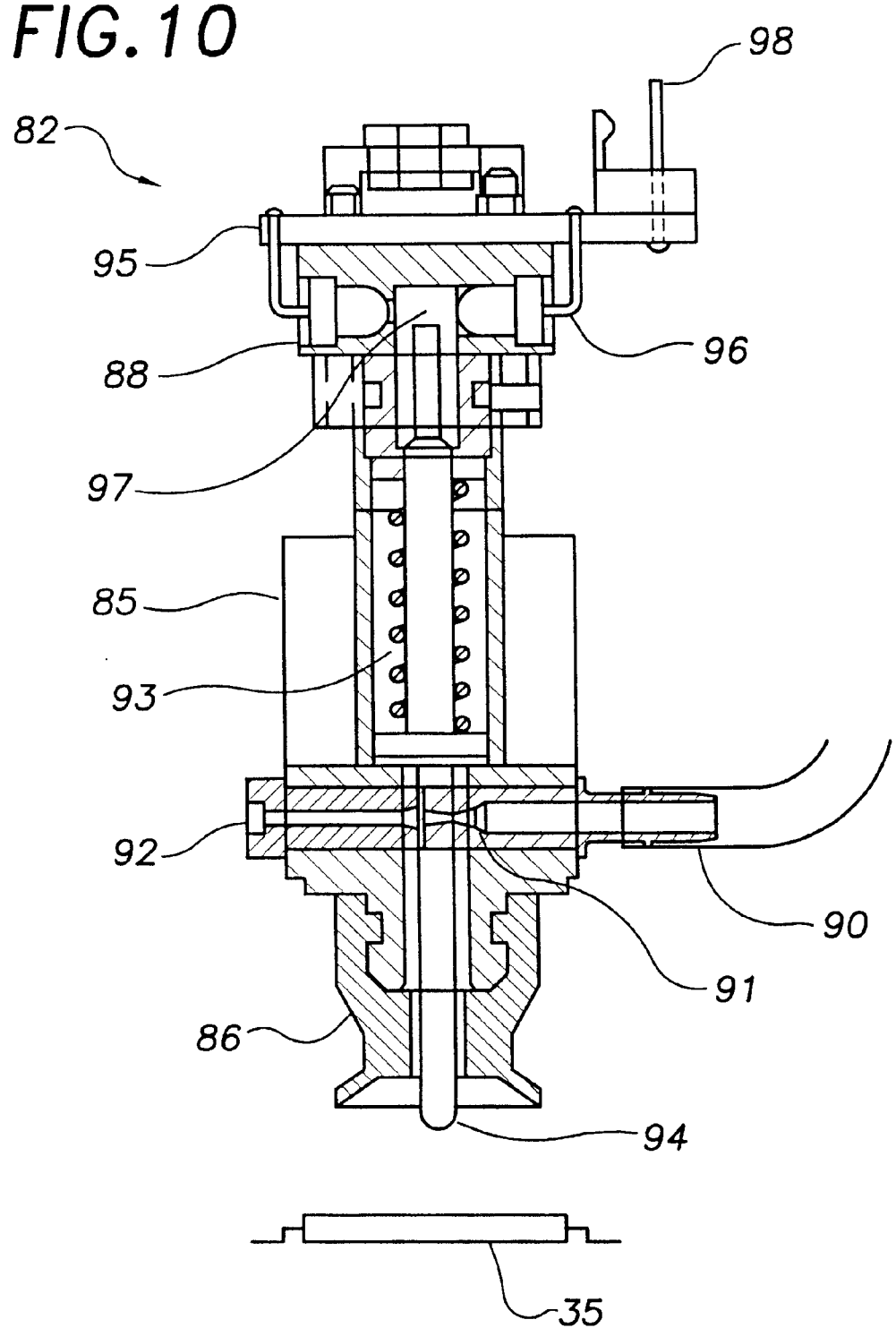
FIG. 10 is a detailed cutaway side view of a vacuum head.

Turning now to FIG. 10, a detailed cross-section of vacuum head 82 is shown. Each vacuum head 82 includes a vacuum head body 85, a vacuum cup 86 mounted to the body 85, a sensor 88, a pressurized air line 90, and a vacuum creating venturi 91. The vacuum head body 85 houses the air line 90 and the venturi 91 which are in communication with the vacuum cup 86. The computer system 18 controls a valve (not shown) which controls the supply of pressurized air in the air line 90. The air line 90 provides pressurized air to the venturi 91. The pressurized air passing through the venturi 91 generates vacuum at the vacuum cup 86. The vacuum at the vacuum cup 86 is sufficient to pick up the part 35. The pressurized air exits the vacuum head 86 at exhaust 92. The sensor 88 includes a part-touching probe 94 that is vertically biased by a spring 93 within the body 85. The sensor 88 includes a circuit board 95 upon which a photo detector 96 is mounted. The photo detector 96 has a cavity 97 which is in-line with the probe 94. The photo detector 96 communicates via pin 98 with the computer system 18. The probe 94 is vertically displacable relative to the vacuum body 85 and photo detector 96. When the vacuum head 82 is positioned over a part 35 and the vacuum head 82 lowered, the probe 94 is vertically displaced as it comes into contact with the part 35. Displacement of the probe 94 into the cavity 97 causes the photo detector 96 to generate a signal proportional to the probe 94 displacement. The displacement signal from the photo detector 96 is communicated to the computer system 18 via pin 98. This signal indicates to the computer system 18 that the part 35 was detected by the sensor 88 and further allows the computer to calculate the distance between the vacuum head and the part 35. If the sensor 88 fails to signal the computer system 18 at the appropriate time, then the computer system 18 may conclude that a part is either missing or was dropped by the particular vacuum head 82. Thus, the sensor 88 provides the handler computer system 18 with accurate tracking data concerning parts in the handler 10.

Figure 11:
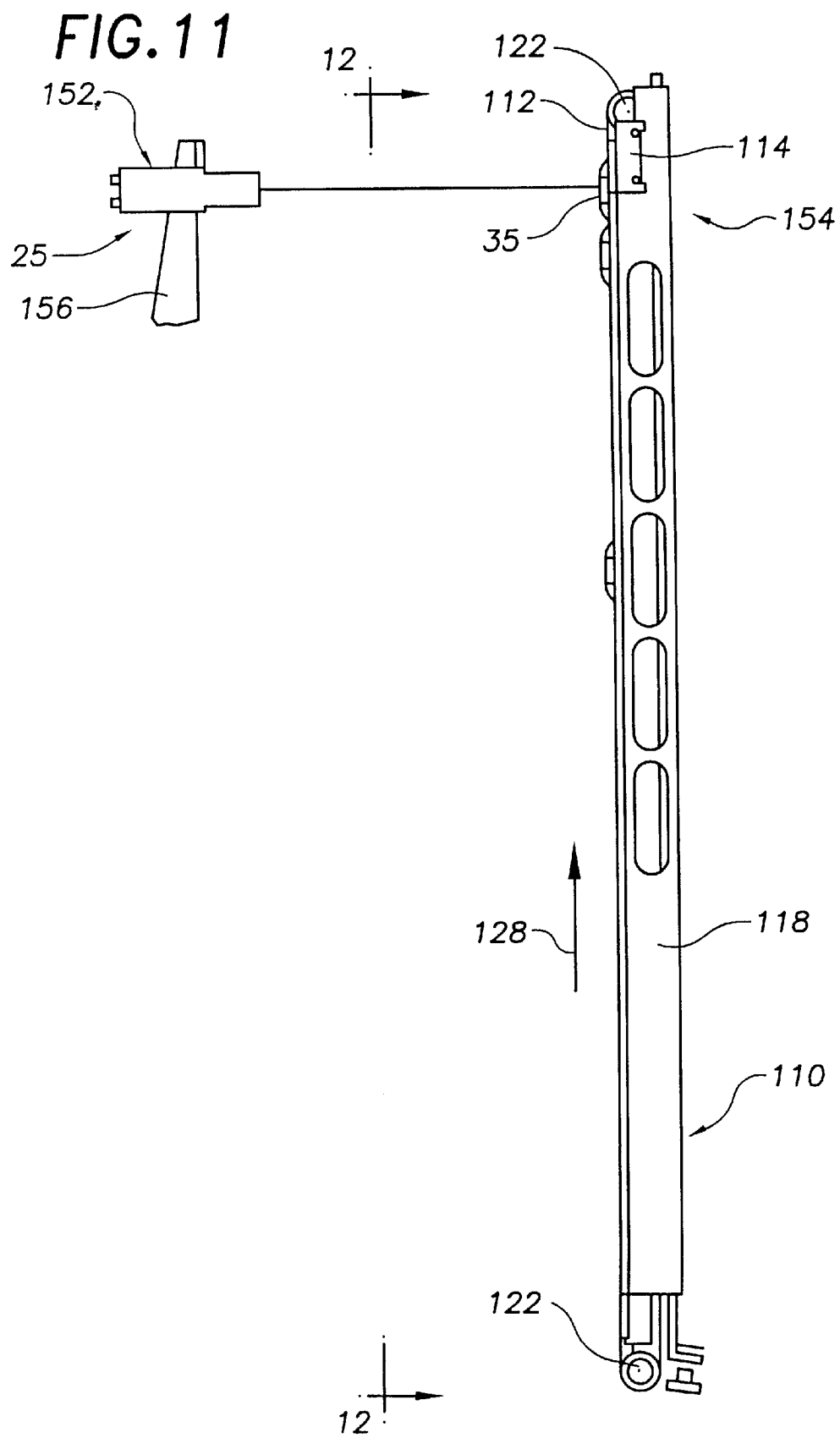
FIG. 11 is a side view of an input belt assembly with an input side camera.

The next stage in the handler 10 is the input belt assemblies 110, shown in FIGS. 11 and 12. Each input belt assembly 110 is comprised of an input belt 112, an input belt motor 114, and a precisor rail 126. FIG. 11 shows an input side camera 152, which is part of the vision system 25, supported by a crossbar 156 above the input belt 112.

As depicted in FIG. 15, eight input belt assemblies 110 are included in the preferred embodiment. Depending on system parameters such as the throughput capabilities of the test contactor 6 and other testing requirements, the number of input belt assemblies 110 can be increased or decreased accordingly. Also shown in FIG. 15 is an adjustable end stop 151 having a stop edge 151 which serves to precisely orient the parts 35 in the direction of motion of the input belts 112. The function of the adjustable end stop 151 operating in conjunction with the vision system 25 and the computer system 18 is more fully described below.

FIGS. 11 and 12 show a housing 118 that is included in each input belt assembly 110. The housing 118 supports a pair of rollers 122 which turn input belt 112. As depicted in FIG. 13, the housing further includes an exterior surface 124 which supports the input belt 112. Static dissipaters 125 serve to prevent static electricity build-up which, if not dissipated, can be quite harmful to parts 35.

FIGS. 12, 13, and 14 show the precisor rail 126 which is attached to the housing 118. As depicted in FIG. 14, the precisor rail 126 is orientated on the housing 118 such that the rail 126 is non-parallel to the direction of motion 128 of the input belt 112. Testing of the input belt assembly 110 indicates that an angle of approximately 0.18° (shown in FIG. 14 as reference numeral 130) between the precisor rail 126 and the direction of motion of the input belt 128 is preferred. The precisor rail 126 is preferably a steel alloy and has a guiding edge 132 which is precisely machined to have a straight and smooth surface.

Referring again to FIG. 12, each input belt 112 has a loading end 134 and an unloading end 136. Parts are placed on the loading end 134 by the input gantry 70. The gantry 70 places an entire column of parts 36 on a single input belt 112. The rollers 122, in contact with the input belt 112, are propelled by the input belt motor 114. The input belt motor 114 is controlled by the computer system 18. As the input belt 112 moves the parts 35 towards the unloading end 136, the slight angle between the precisor rail 126 and the direction of motion of the input belt 128 causes the parts 35 to be biased against the guiding edge 132 of the precisor rail 126. The smooth surface of the guiding edge 132 prevents any "sticking" or turning of the parts 35. At the unloading end 136 of the input belt 112, the parts 35 are precisely orientated against the guiding edge 132 of the precisor rail 126.

Figure 16:
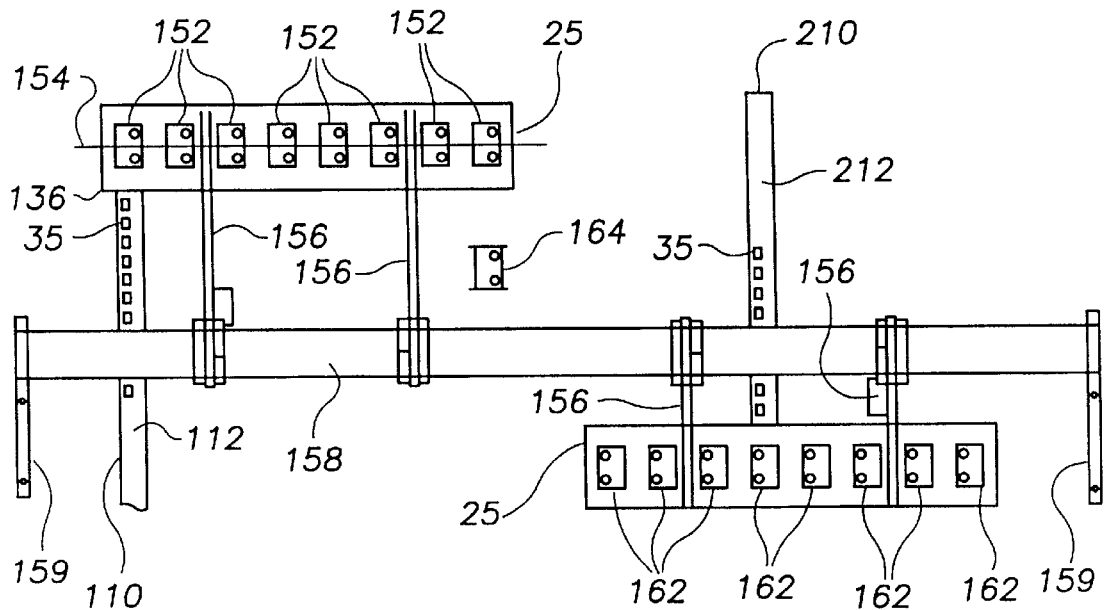
FIG. 16 is a top view of a vision system including one input belt assembly and one output belt assembly.
Figure 17:
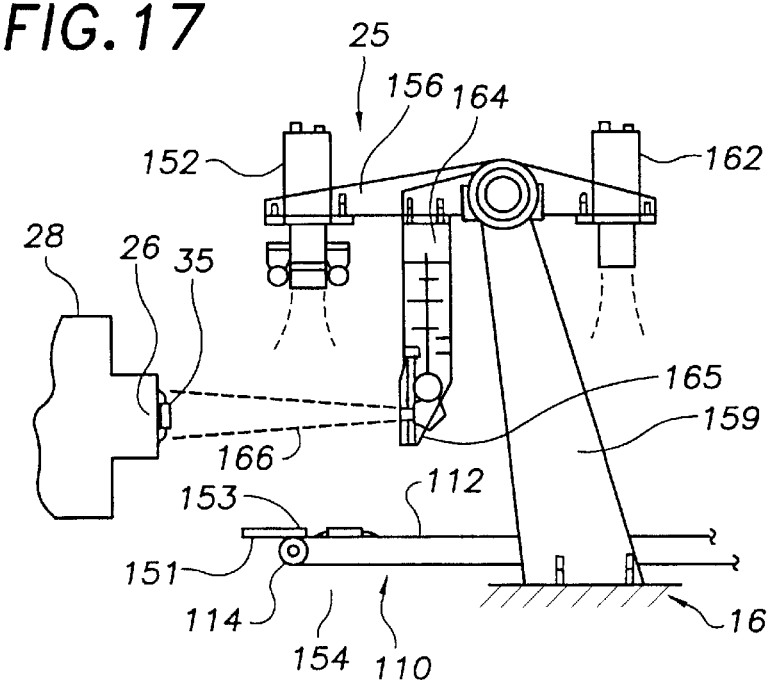
FIG. 17 is a side view of the vision system including the test contactor and the input belt assembly.

The vision system 25, shown in FIG. 16, includes an input side camera 152 for each input belt assembly 110, an output side camera 162 (more fully described below) for each output belt assembly 210, and a test contactor camera 164 (also more fully described below). As seen in FIGS. 16 and 17, the cameras 152, 162,164 of vision system 25 are supported by four crossbars 156 which are bolted into crosspiece 158. The crosspiece 158 is supported by two girders 159 which are bolted into the chassis 16.

The vision system 25 is integrated with the computer system 18 such that the input side cameras 152 communicate vision data to the computer system 18 which in turn provides the input belt motors 114 with positioning signals. Each camera 152 is located above the unloading end 136 of each input belt 112 (for clarity, only one input belt 112 is shown) and looks down on the input belt 112. The camera 152 detects the presence of a part 35 and using vision software, currently available from ICOS Co. of Waltham, Mass. and Heverlee, Belgium, the computer system 18 determines the centroid of the part 35. The computer system 18 then calculates the distance between the centroid of the part 35 and a desired end point 154 (shown in FIG. 15). Based upon this calculation, the computer system 18 provides a signal to the input belt motor 114 which moves the input belt 112 accordingly. In the preferred embodiment, the input belt motor 114 moves the input belt 112 slightly further than the calculated distance. This slight overshoot is preferably about 0.020 inches. In this manner, and as depicted in FIGS. 12, 14 and 15, the progress of parts 35 on each input belt 112 is halted by the stopping edge 153 of the adjustable end stop 151. The stopping edge 153 provides precise and repeatable positioning of the part 35.

Thus, the "naked" parts 35 on each input belt 112 are precisely and repeatably orientated on two axes (along each precisor rail 126 and at the stopping edge 153). The rotation (or theta orientation) of the part 35 is also fixed. Additionally, the part orientation provided by the precisor rail 126 and the adjustable end stop 151 operating in conjunction with the vision system 25 is robust in that different part sizes, thicknesses, types, and shapes can be easily introduced into the handler 10.

Furthermore, the position of the adjustable end stop 151 is controllable by an end stop motor 155. The end stop motor 155 moves the adjustable end stop 151 so as to orient the part 35 at the desired end point 154. The initialization procedure for the handler 10 includes a calculation by the computer system 18 as to the location of the desired end point 154 and it is based upon where the trolley assembly 22 will pick up the parts. The position of the adjustable end stop 151 can be automatically modified for different part sizes or for any handler distortion (thermal or otherwise). This is especially important if, for example, high or low temperature testing causes thermal expansion of portions of the handler 10.

In an alternative embodiment, the adjustable end stop 151 is eliminated and the desired end point 154 is dynamically controlled by each individual input belt assembly 110. Although all the parts 35 in FIG. 15 show a common desired end point 154, they need not be collinear. In this alternative embodiment, the computer system 18 provides dynamic control of each input belt 112. Iterative processing between the camera 152, the computer system 18, and the input belt motor 114 positions the part 35 precisely at each desired end point 154. When the part 35 is accurately positioned at the desired endpoint 154, the computer system 18 stops the input belt motor 114 and the part 35 is ready for transfer to the test contactor 6 (shown in FIG. 2a).

Figure 18:
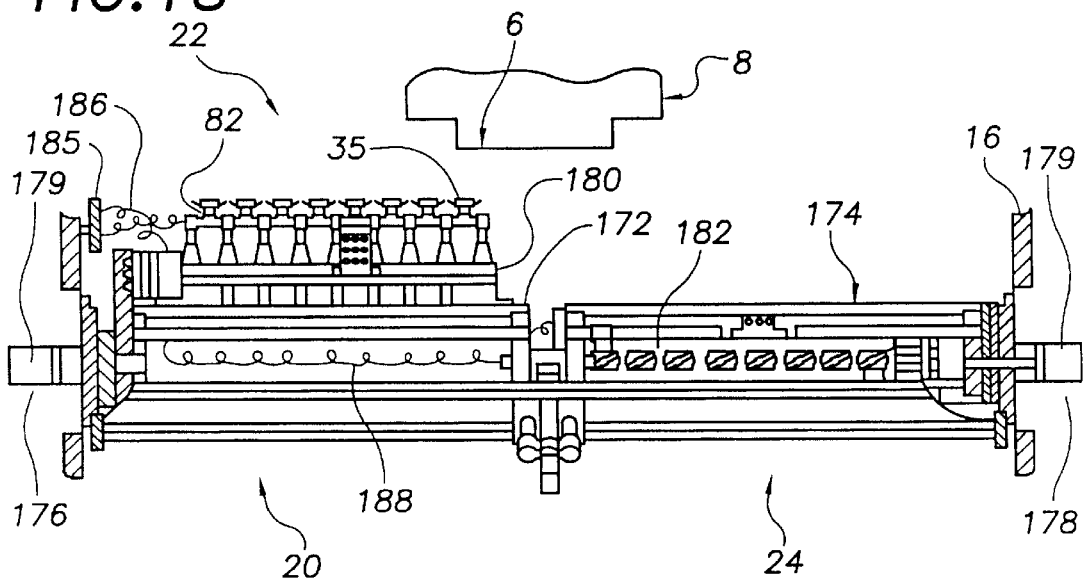
FIG. 18 is a top view of a trolley assembly.
Figure 19:
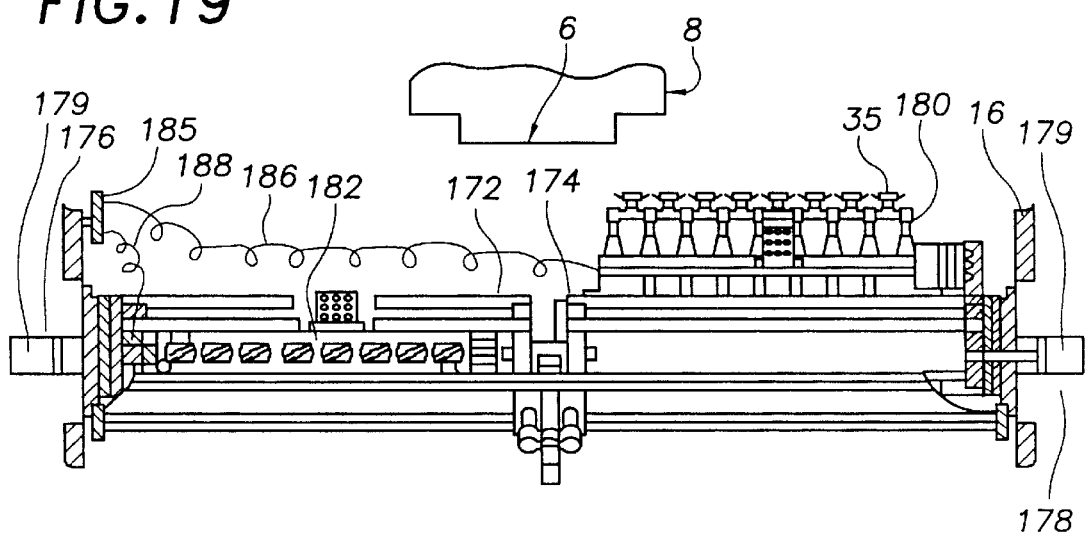
FIG. 19 is a top view of the trolley assembly at a different stage of operation.

Turning to the next transfer operation performed by the handler 10, FIG. 3 depicts a side view of the trolley assembly 22. The trolley assembly 22 transfers parts 35 from the desired endpoint 154 (see, e.g., FIG. 15) of each input belt 112 to the test contactor 6. After testing, the trolley assembly 22 transfers the parts 35 to the output belts 212. Referring now to FIGS. 18 and 19, a top view of the trolley assembly 22 is depicted. To provide clarity, the input belt assemblies, output belt assemblies and the cameras are not shown in FIGS. 18 and 19. In the preferred embodiment, the trolley assembly 22 includes two drums 172 and 174. Drum 172 is positioned over the input side 20 and drum 174 is positioned over the output side 24. The drums 172, 174 are mounted to the handler chassis 16 and they are fully restrained by the chassis 16 except for rotation about axis 179. Each drum 172, 174 has a motor 176, 178 which independently rotates its corresponding drum 172, 174 about axis 179. The motors 176, 178 are controlled by the computer 18.

As shown in FIG. 21, a cross-sectional side view of the trolley assembly 22, the drums 172, 174 each comprise eight drum shafts 175 constrained in a circular configuration by spider brackets 177. An essential feature of the entire trolley assembly 22, including the drums 172, 174 is its skeletal nature. The skeletal design of the trolley assembly permits the cameras 152, 162, 164 (see FIGS. 3, 11 and 17) positioned above the trolley assembly 22 to view the parts with minimal obstruction from the trolley assembly 22.

The trolley assembly 22 also includes two trolleys 180, 182 which transfer the parts 35. The trolley 180, as shown in FIG. 21 is slidably mounted on two of the shafts 175 of drum 172. Relative to the drum 172, the trolley may only move along the drum shafts 175 in a horizontal direction which is parallel to axis 179. The trolleys 180, 182 may cross from one drum to the other when the drum shafts 175 line-up as shown in FIG. 20 (for clarity, the trolleys are not shown in FIG. 20). Horizontal movement of the trolleys 180, 182 is controlled by lead screws. A lead screw 181 is shown in FIG. 21 and is driven by a lead screw motor (not shown). A lead screw and lead screw motor (both not shown) correspondingly control the other trolley 182. The lead screw motors are controlled by the system computer 18.

The trolleys 180, 182 include vacuum heads 82 similar to those used in the input gantry 70. Each vacuum head 82 has an associated cam (not shown) which causes the vacuum head 82 to extend when a cam shaft (also not shown) is rotated. The cam shaft is controlled by the computer 18. As in the input gantry 70, the computer system 18 also the vacuum in the vacuum heads 82 of the trolleys 180, 182. Vacuum is supplied to the trolleys 180, 182 by vacuum lines 186 (attached to trolley 180) and 188 (attached to trolley 182).

The vacuum lines 186, 188 are flexible and extend from a rotary feed-through mechanism 185 which is mounted to the chassis 16. The rotary feed-through 185 includes seals, gears and chambers, as well as two chain drives. The vacuum lines 186, 188 must be rotated 180° for each cycle of the two trolleys 180, 182. This prevents tangling of the lines 186, 188. Furthermore, the vacuum lines 186, 188 also rotate relative to the mechanism to prevent twisting within the vacuum lines 186, 188 themselves.

The procedure for transferring parts is as follows. As a result of the precise part orientation on the input belt assembly 110 and the data from the input side cameras 152, the computer system 18 "knows" that each part is at the desired end point 154 along the precisor rail 126 and stopping edge 153 of each input belt assembly 110. The computer system 18 positions the trolley 180 (having vacuum heads 82) along the drum 172 and above the parts 35 with the lead screw 181. Cam shafts within the trolley 180, lower the vacuum heads 82 to pick up the parts 35. After the parts 35 are picked up, the drums 172, 174 are each rotated ninety degrees (in opposite directions) by the motors 176,178. The picked up parts are interfaced with the test contactor 6 of test station 8. The lead screw 181 moves the trolley 180 along the lined-up drums 172, 174, moving the trolley 180 from drum 172 to drum 174. After the electrical test at the test contactor 6 is complete, the trolley 180 moves so that it is completely on the output side drum 174 (see FIG. 19). The drum 174 is then rotated ninety degrees to position the parts 35 over the output belt assemblies 210. The computer 18 then releases the vacuum in the vacuum heads 82 and the parts are placed on the output belts 212.

While trolley 180 is testing parts at the test contactor 6, the other trolley 182 moves in the opposite direction towards drum 172. In this manner, while trolley 180 is dropping parts off on the output side 24, the other trolley 182 is able to pick up a new batch of parts on the input side 20. Thus, by using two trolleys 180, 182 and two drums 172, 174 operating in parallel, the handler 10 can deliver a more nearly continuous stream of parts to the test contactor 6.

The vision system 25 also operates in conjunction with the trolley assembly 22. Another function of the vision system 25 is to provide visual data to the computer system 18 for precisely orienting the trolley assembly 22. Referring back to the side view of the vision system 25 in FIG. 17, test contactor camera 164 looks down at a prism 165. A field of view 166, refracted through prism 165, allows the camera 164 to view part 35 at the test contactor 6. Additionally, the camera 164 views vacuum head 82 alignment with the test contactor 6. As described above, the structure of the trolley assembly 22 is skeletal in nature such that the camera 164 is not obstructed from viewing the part 35 at the test contactor 6. The camera 164 provides image data to the computer system 18 of the part 35 and test contactor 6 interface. If there is misalignment at the contactor 6 in the vertical direction, the desired endpoint 154 can be adjusted by the computer system 18. Adjustment of the desired endpoint 154 (physically effectuated by adjusting the adjustable end stop 151) causes the part 35, when it is on the trolley assembly 22, to be displaced in a vertical plane relative to the test contactor 6. Similarly, if there is misalignment at the test contactor 6 in the horizontal direction, the lead screw motors (not shown) can likewise be adjusted by the computer system 18 to change the horizontal position of the part 35. Thus, the test contactor camera 164, in conjunction with the computer system 18, robustly allows the handler 10 to adjust part alignment at the contactor 6 while the handler 10 is operating.

Turning now to the output side 24 of the handler 10, depicted in FIG. 2 (and in FIG. 22), it is noted that the output side 24 is very similar to the input side 20. The output side 24 includes output belt assemblies 210, an output sorter 240 and an output tray mechanism 280.

Figure 22:
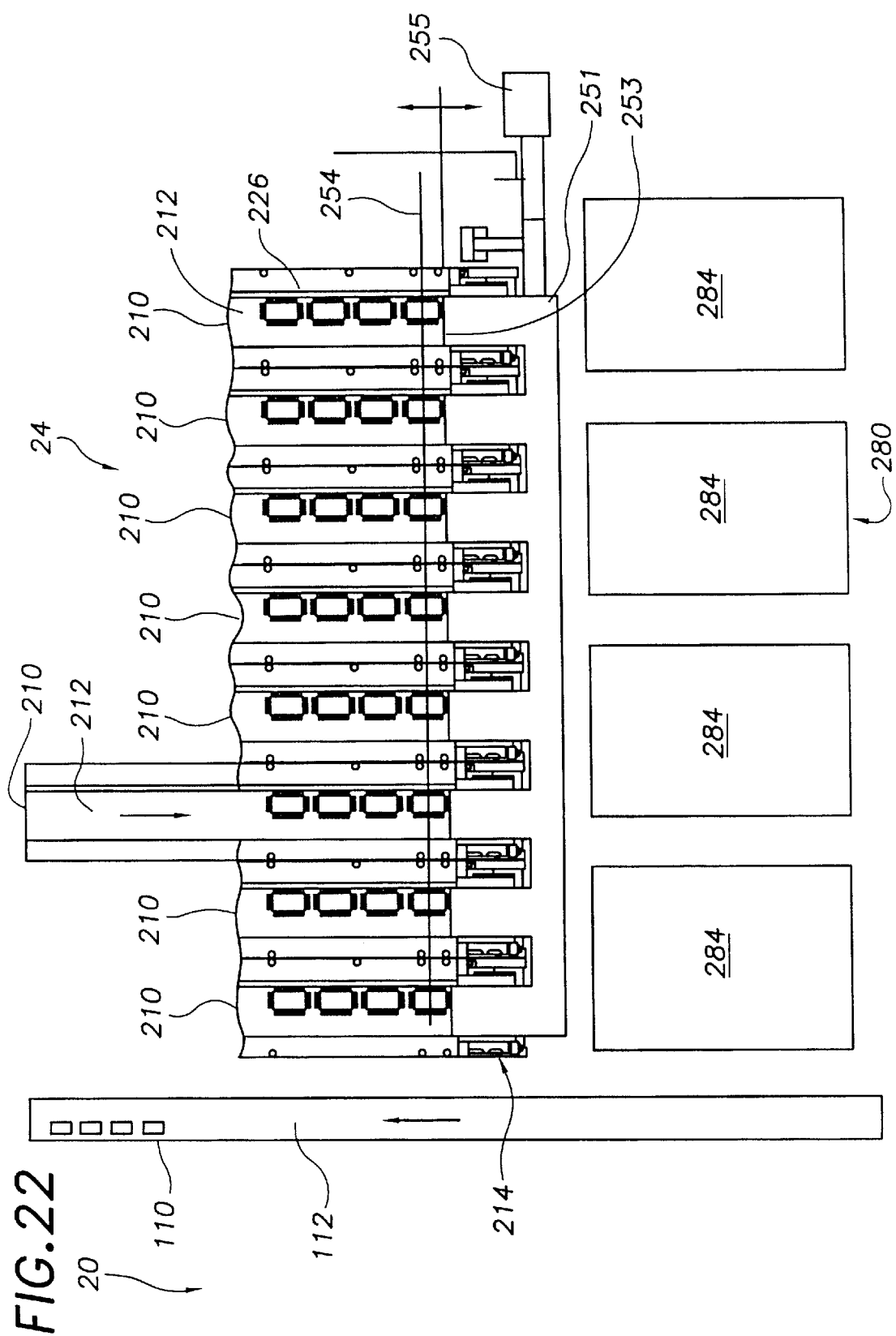
FIG. 22 is a top view of eight output belt assemblies with the output side adjustable end stop and output trays.

As seen in FIG. 22, each output belt assembly 210 is comprised of an output belt 212, an output belt motor 214, and a precisor rail 226. Eight output belt assemblies 210 are shown in FIG. 22. The number of output belts assemblies 210 can be increased or decreased, but to maintain optimal parallelism the number of output belt assemblies 210 should equal the number of input belt assemblies 110 (for clarity, only one input belt assembly 110 is shown in FIG. 22). Also shown in FIG. 22 is an adjustable end stop 251 with a stopping edge 253 coupled to end stop motor 255 controlled by computer 18. In the same manner as the input side 20, the adjustable end stop 251 on the output side 24 precisely aligns parts 35 at a desired endpoint 254 at the end of the output belts 212.

The output belt assembly 210 and its operation is identical to the input belt assembly 110 described above, except in two respects. First, the output belt assemblies 210 are rotated one hundred eighty degrees in the horizontal plane relative to the input belt assemblies 110. Thus, the direction of motion of the output belts 212 is opposite to that of the input belts 112. Second, the length of the output belt assemblies 210 is shorter than the output belt assemblies 110. This allows the output tray mechanism 280, with output trays 284, to be located more compactly within the handler 10. Other than these two minor differences, the output belt assemblies 210 operate in the same manner and position parts 35 with the same accuracy along the precisor rail 226 and at the stopping edge 253 as the input belt assemblies 110 described above.

The final transfer operation performed by the handler 10 involves the output sorter 240 on the output side 24 as shown in FIG. 2. The output sorter 240 transfers the parts 35 from the desired end point 254 on the output belts 212 to the output tray mechanism 280. The output tray mechanism 280 includes output trays 284. Similar to the input trays 32, the output trays 284 are preferably standard trays as used in the semiconductor industry. Placement of parts 35 in the output trays 284 by the output sorter 240 is performed based upon test results from the test contactor 6. Thus, if a part 35 fails the electrical test, the output sorter 240 places the part 35 in an output tray 284 earmarked for failed parts.

The general location of the output sorter 240 on the output side 24 is shown in FIG. 2a. In the preferred embodiment, the output sorter 240 is supported by a mounting bracket 250 which is slidably mounted in an arm 242. The arm 242 is slidably mounted in a track 244. The track 244 is bolted to the chassis 16 on output side 24. The bracket 250 movement within the arm 242 and the arm 242 movement within the track 244 allows x-y positioning of the output sorter 240. An arm motor 245 moves the bracket 250 within the arm 242 and a track motor 247 moves the arm 242 within the track 244. The motors 245, 247 are controlled by the system computer 18.

The output sorter 240 is the primary component in the last transfer stage of the handler. Because the handler processes many parts in parallel, the individual part placement operation of the output sorter 240 must operate at high speeds. To facilitate the high speed operation, all portions of the output sorter 240 are made of light-weight materials and the motors are preferably high speed as well.

Figure 23:
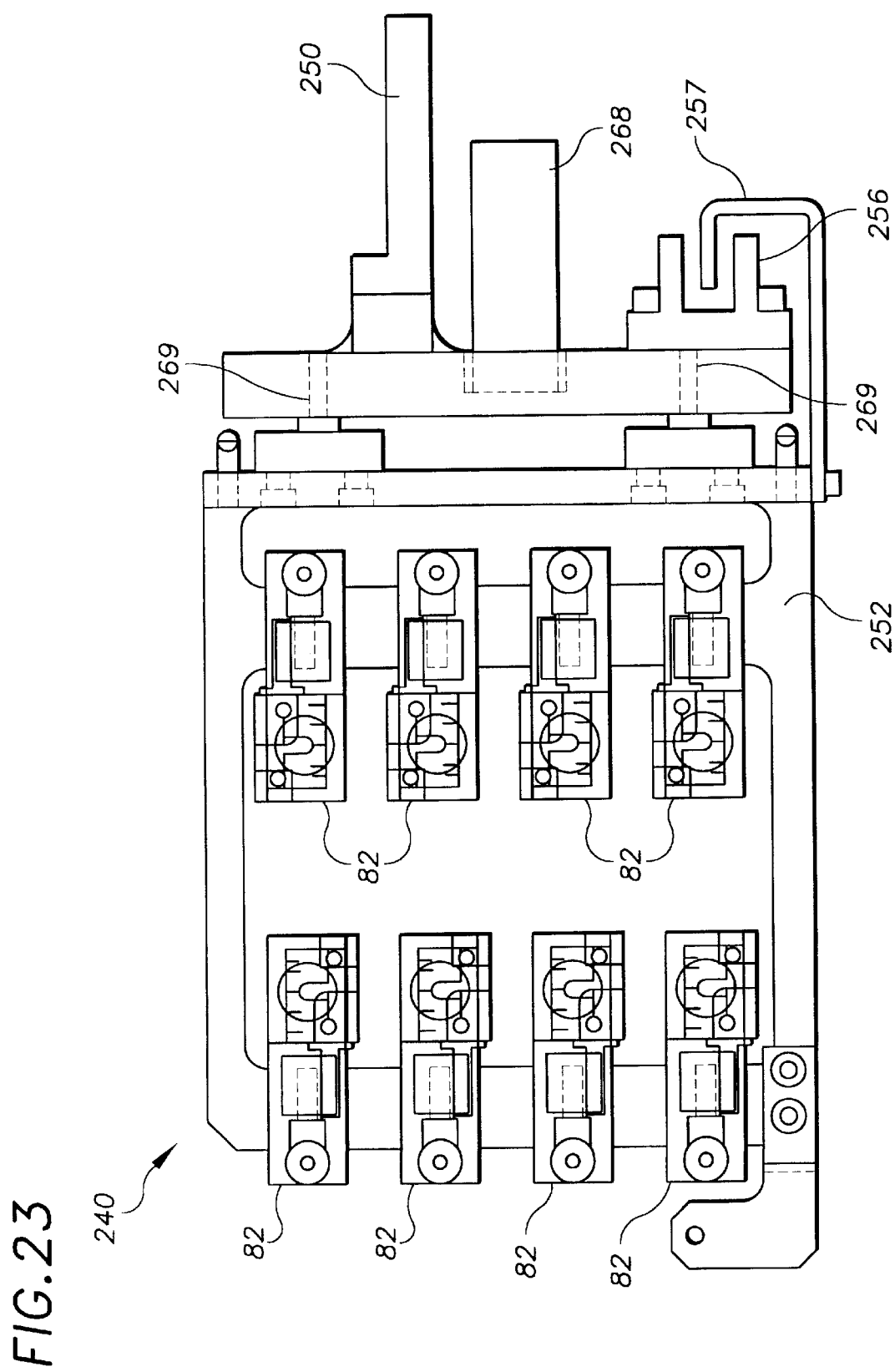
FIG. 23 is a top view of a output sorter.

Turning to FIG. 23, a top view of the output sorter 240 is shown. The output sorter 240 includes the mounting bracket 250, a support plate 252, a vertical displacement motor 254 and vacuum heads 82. The mounting bracket 250 includes guiding slots 255 to restrain movement of the plate 252 (relative to the bracket 250) in all directions except the vertical direction. The mounting bracket also houses the vertical displacement motor 254. The displacement motor 254 supports the plate 252 in the vertical direction and governs the vertical positioning of the plate 252. The computer system 18 controls the displacement motor 254.

A slotted photo sensor 256 provides the computer system 18 with displacement data. The photo sensor 256 is slotted and is mounted on the bracket 250. A marker 257 mounted to the plate 252 is disposed within the slotted photo sensor 256. The photo sensor is electrically connected (not shown) to the computer system 18. When the marker 257 moves within the photo sensor 256, the photo sensor 256 provides the computer system 18 with the relative position between the bracket 250 and the plate 252. The computer system 18 can control the displacement motor 254 based upon the displacement data provided by the photo sensor 256. Thus, the vacuum heads 82 mounted to the plate 252 can be adjusted in unison depending upon part height and output tray 284 depth. Additionally, the vacuum heads' 82 vertical position can be adjusted "on the fly" by the computer system 18 so as to adjust to different part heights and output tray 284 depths.

Figure 24:
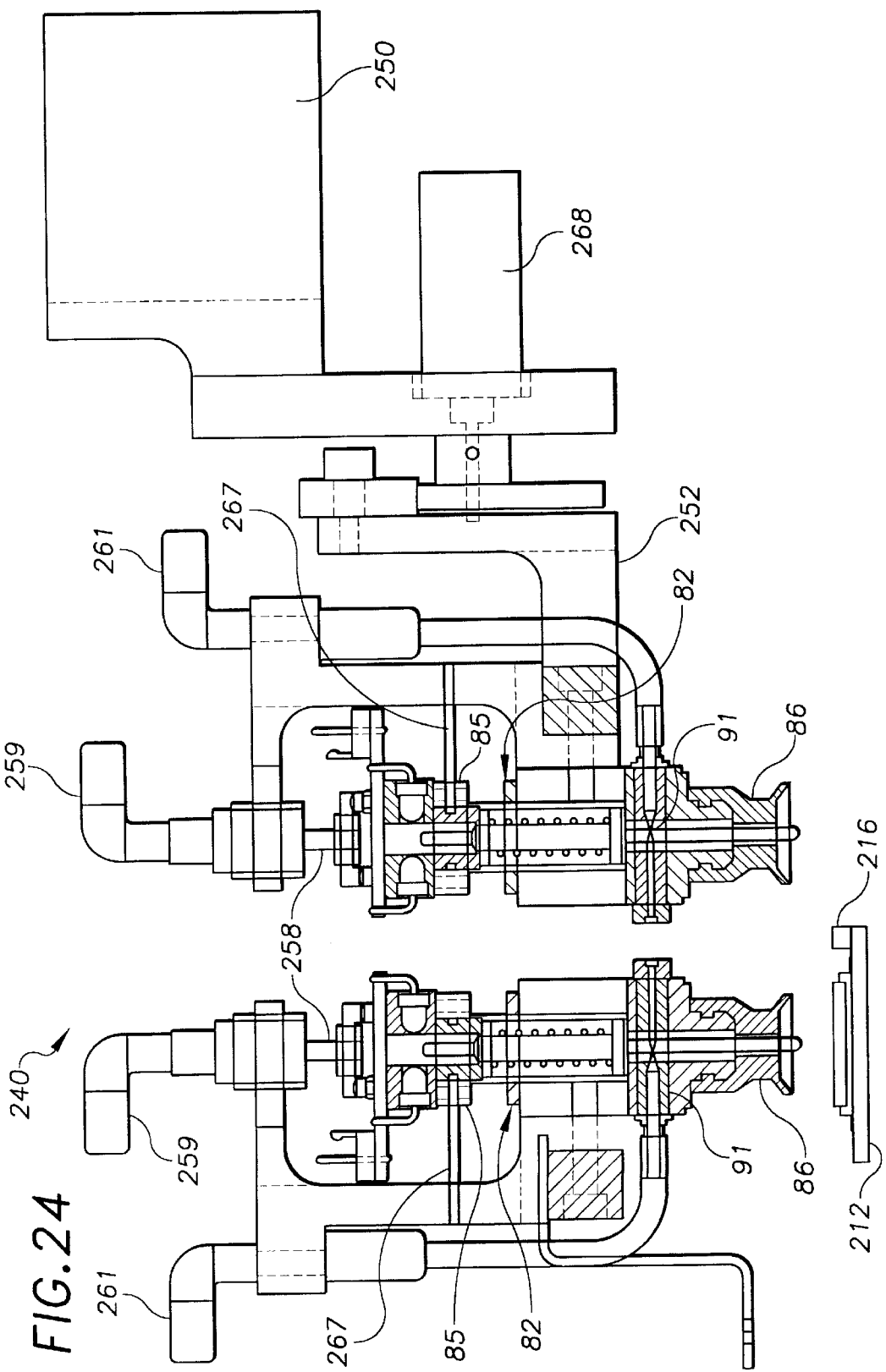
FIG. 24 is a side view of the output sorter.

The vacuum heads 82 of the output sorter 240 are each mounted on the plate 252 and operate in substantially the same manner as described above with respect to the vacuum heads 82 of the input gantry 70 (see also FIG. 10). The primary difference between the output sorter 240 and the input gantry 70 is that the output sorter 240 individually controls the vacuum heads 82. As seen in the FIG. 24 side view of the output sorter 240, the top of the vacuum head 82 further includes a piston 258 which is attached via tube 259 to a pressurized air supply (not shown). The pressurized air flow to each piston 258 is controlled by the computer system 18. The computer system 18, therefore, can control the downward thrust of the piston 258 which in turn moves the vacuum cup 86 downwards to pick up the part 35 (positioned by precising rail 216 and the adjustable end stop 251) on output belt 212. The vacuum head body 85 includes a nub 267 which limits the downward motion of the vacuum head 82 relative to the bracket 252. Additionally, the pressurized air in each tube 261 (each of which is connected to the vacuum creating venturi 91), is likewise controlled individually by the computer system 18. Thus, the output sorter 240 can pick up individual parts 35 and release the parts 35 individually into the appropriate location in the output trays 284.

Figure 25:
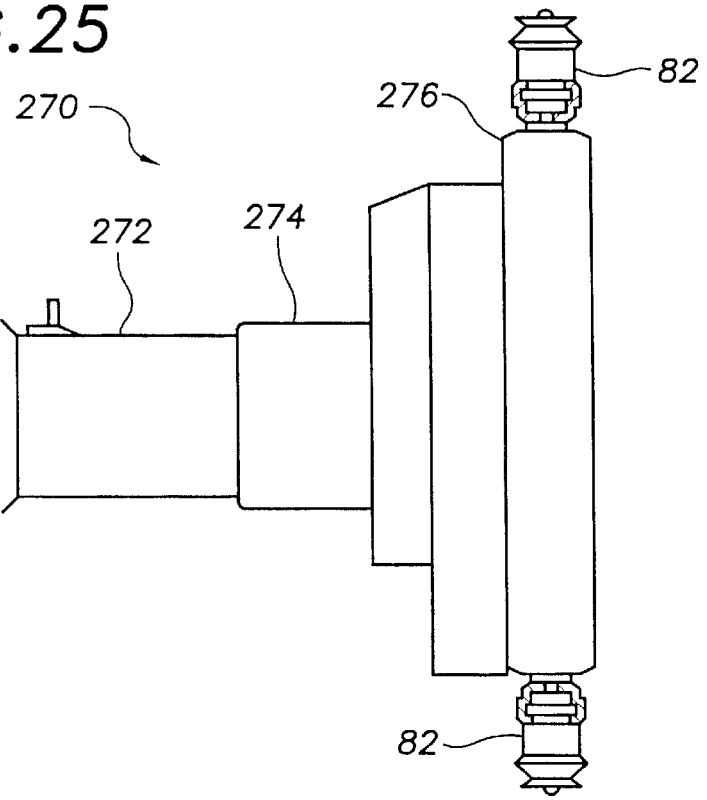
FIG. 25 is a top view of an alternate embodiment of the output sorter.
Figure 26:
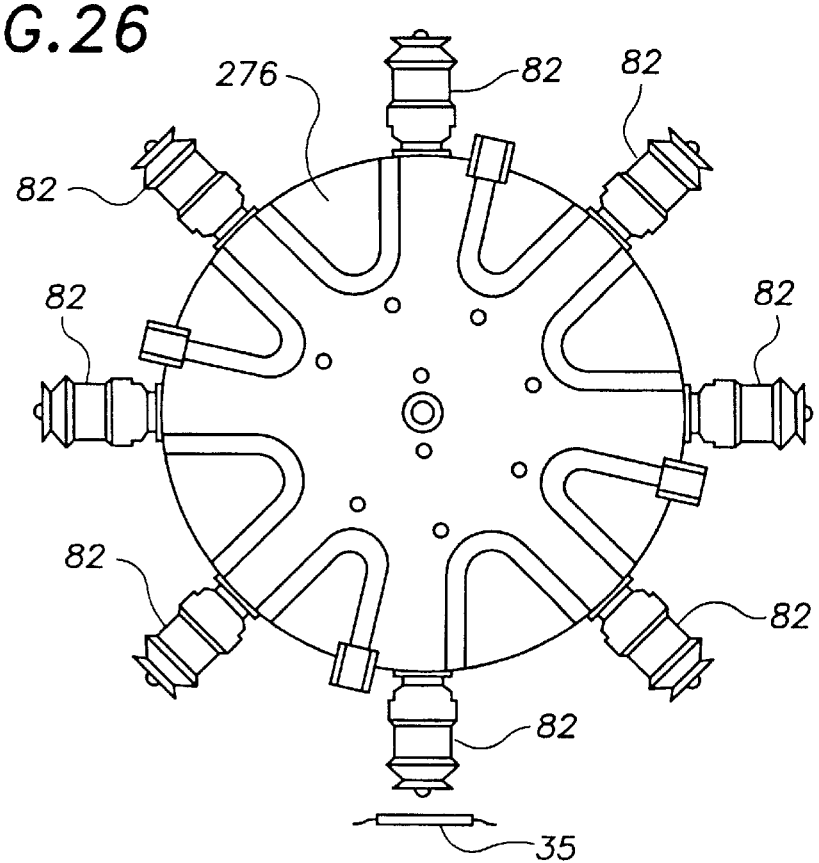
FIG. 26 is a side view of an alternate embodiment of the output sorter.

There are numerous effective arrangements of the vacuum heads 82 within the output sorter 240. In one such arrangement, an alternative embodiment depicted in FIGS. 25 and 26, the output sorter 240 is instead an eight-station rotary sorter 270. FIG. 25 is a top view of the rotary sorter 270. The rotary sorter 270 includes a shaft 272 which is slidably mounted in the arm 242. The x-y motion of the rotary sorter 270 along the arm 242 and track 244 is the same as the output sorter 240.

The rotary sorter 270 further includes a high-speed shaft motor 274 and a rotatable disk 276 which houses vacuum heads 82. The vacuum heads 82 in the rotary sorter 270 are the same as those in the output sorter 240. Compressed air is supplied internally to the rotatable disk 276. The supply of compressed air to each of the vacuum heads 82 is individually controlled by the computer system 18. The shaft motor 274 is also controlled by the computer system 18 and rotates the disk 276. The shaft motor 274 also moves the rotatable disk 276 in the vertical direction, so as to adjust for part 35 height and output tray depth.

The output sorter 240 (and, in the alternate embodiment described above, the rotary sorter 270) is controlled by the computer system 18 and x-y part placement within the output trays 274 can be based upon the test data from the test contactor 6. In another alternate embodiment more fully described below, the test data also includes mechanical inspection results from the vision system 25. Because the output sorter 240 can place individual parts one by one within the output trays, it can place "bad" parts in a particular tray or even in a particular position within the tray.

The output tray mechanism 280, shown in FIGS. 2a and 22, operates in a manner similar to the input tray mechanism 30. However, in the preferred embodiment, the output tray mechanism includes four working output trays 284.

Finally, returning to the vision system 25 depicted in FIG. 16, in addition to providing visual data to the computer system 18 for part 35 alignment, the system 25 can also inspect parts 35 for mechanical defects. The computer system 18 includes mechanical inspection vision software which is also available from ICOS Co. of Waltham, Mass. and Heverlee, Belgium. Mechanically defective parts 35 such as those that have bent or missing leads, improperly sized leads, or other defects or misorientations can be identified by the computer system 18.

Additionally, the cameras 152, 162, 164 provide visual images to the visual inspection software in computer system 18 for three different stages of the handling process. If a defective part is detected by camera 152, the part can be bypassed around the electrical test equipment to prevent damage to the testing contactor 6. If a defective part is identified by camera 164 or 162, but not by camera 152, then computer system 18 alerts an operator that the handler is causing damage to the parts. Furthermore, the output sorter 240 which is controlled by the computer system 18 can sort these defective parts based upon the results from the visual inspection software.

Figure 28:
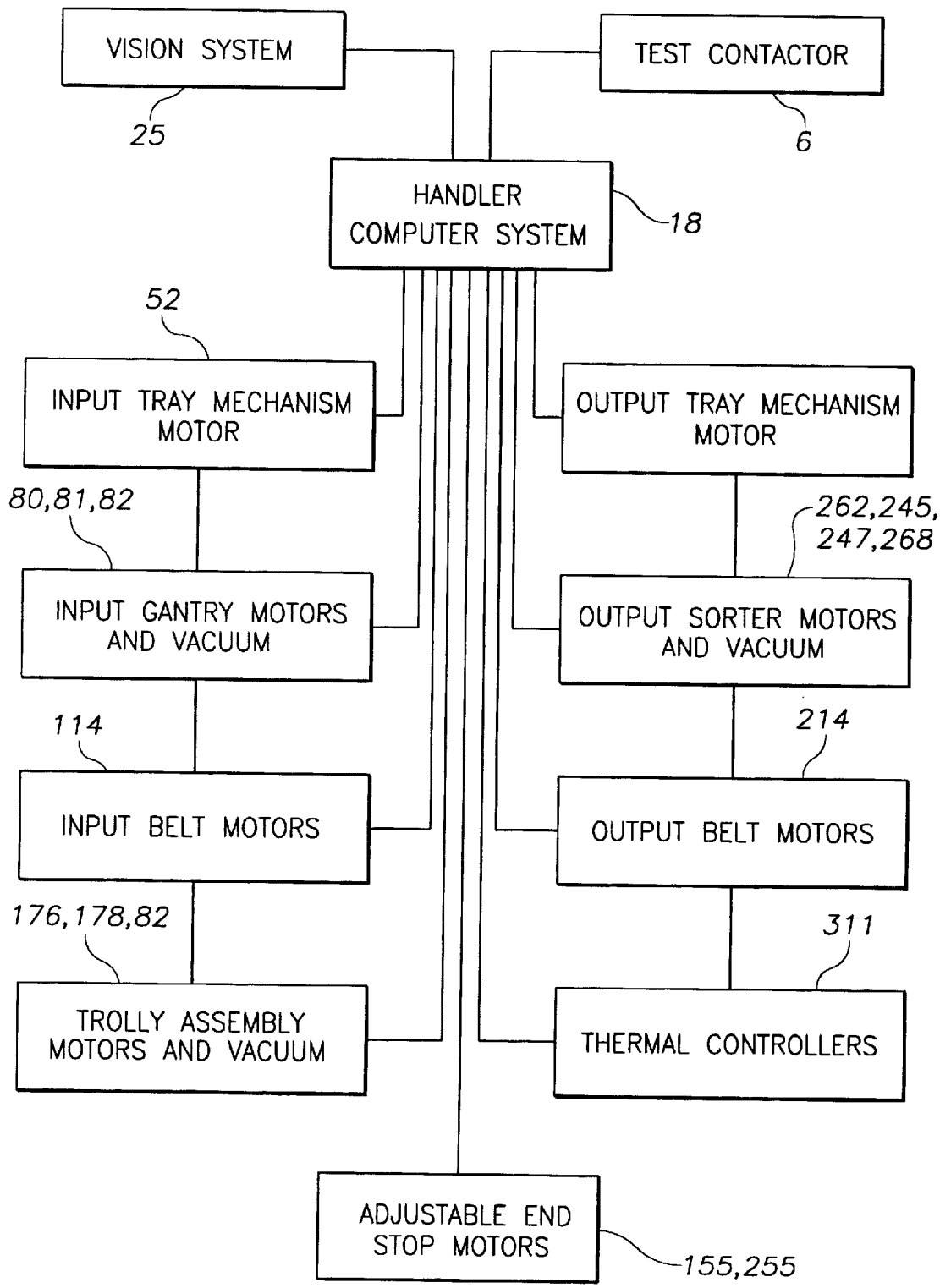
FIG. 28 is a schematic of a computer system for controlling the handler of the present invention.

As shown in FIG. 28, the handler computer system 18 serves to integrate and control the above-described functions of the handler. The computer system 18 receives test data from the vision system 25 and the test contactor 6. Based upon these data, and based upon preprogrammed routines for the handler 10 configuration, part size and tray dimensions, the computer system 18 controls the input tray mechanism motor 52, the input gantry motor 80, the gantry hinge motor 81, the pressurized air all vacuum heads 82, the input belt motors 114, the end stop motors 155, 255, the drum motors 176, 178, the trolley lead screw motors and cam shafts, the output belt motors 214, the output sorter motor 262, the arm motor 245, track motor 247, the vertical displacement motor 254, and the output tray mechanism 280.

Figure 29:
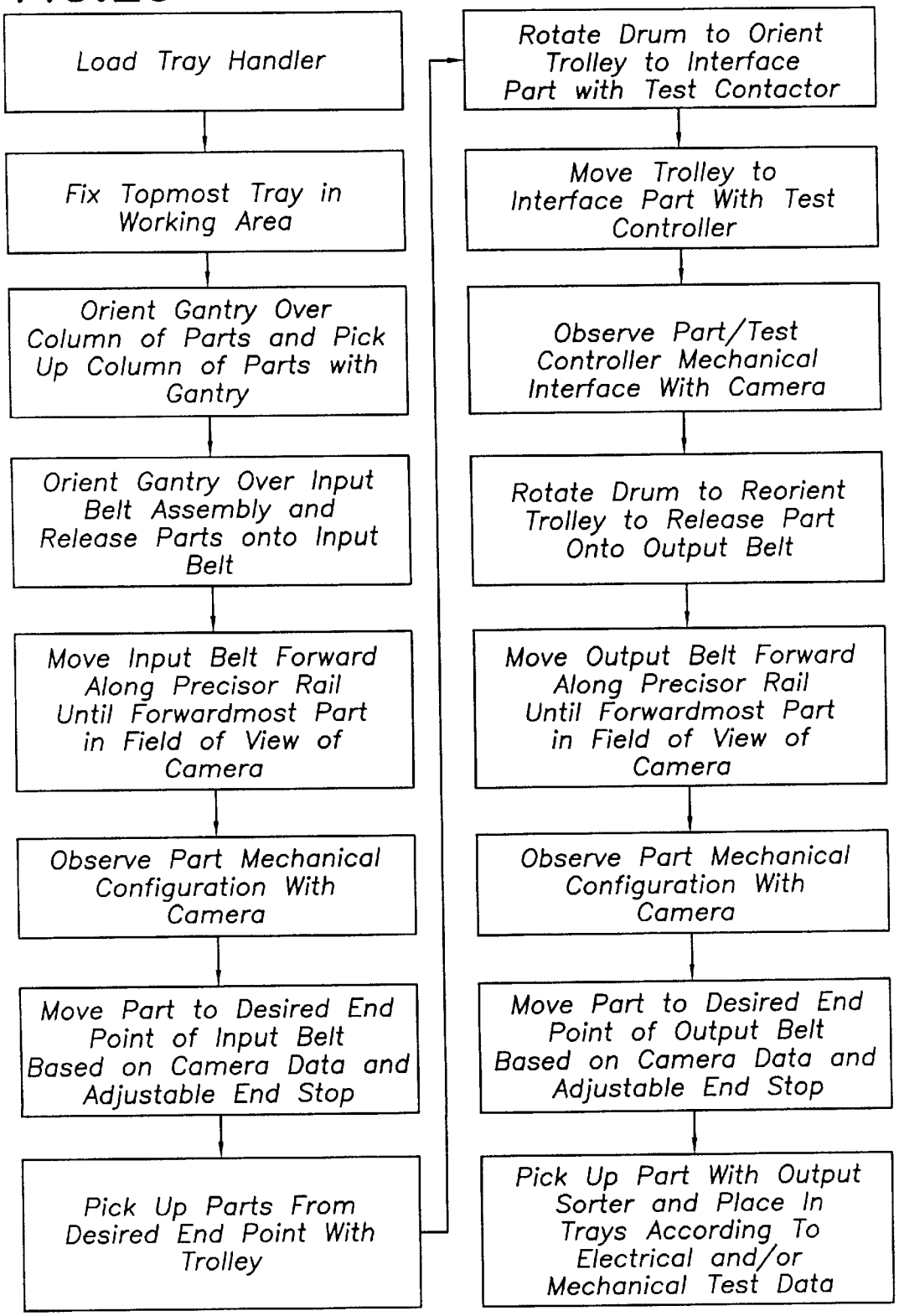
FIG. 29 is a flow chart illustrating a preferred method for practicing the present invention.

FIG. 29 is a flow chart illustrating a preferred method for practicing the present invention.

Figure 27:
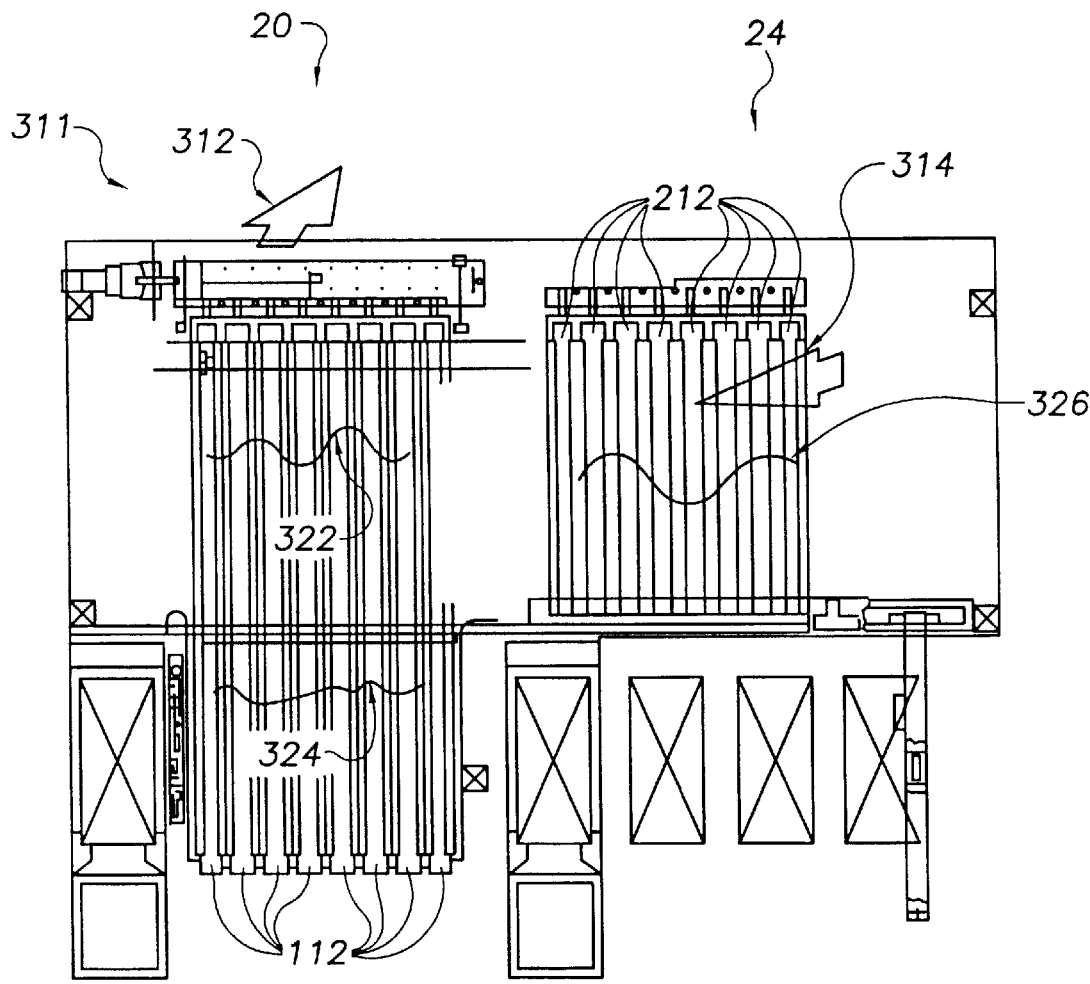
FIG. 27 is a schematic top view of a thermal control system for the handler.

In an alternate embodiment, shown in FIG. 27, handler 10 further contains a thermal control apparatus 311. The thermal control apparatus 311 is controlled by the computer system 18. The thermal control apparatus includes convection heaters 312, 314 on both the input side 20 and the output side 24. The convention heaters 312, 314 include fans which blow thermally conditioned gas (preferably air or nitrogen) across the parts. Two conduction heaters 322, 324 attached underneath the input belt assemblies condition parts on the input belts 112 before testing at the test contactor. A similar heater 326 conditions parts underneath output belts 212. The handler 10 is enclosed by shroud 17 (see FIG. 1) to further aid heating and cooling of the parts. The temperature range of the control apparatus 311 (and the parts in test), in accordance with industry standards, is preferably between +125° C. and −55° C.

While there have been described herein what are considered to be preferred embodiments of the present invention, other modifications of the invention will become apparent to those skilled in the art from the teaching herein. It is therefore desired to be secured in the appended claims all such modifications as fall within the true spirit and scope of the invention. Accordingly, what is desired to be secured by Letters Patent of the United States is the invention as defined and differentiated in the following claims.

I claim:

1. An apparatus for handling parts, the apparatus comprising:
    a plurality of input belts each belt having at least one part;
    a plurality of output belts;
    a trolley assembly which picks up a plurality of parts from the input belts, orients the parts to interface with a test contactor for testing, and subsequent to testing reorients the parts and places the parts on the output belts.

2. The apparatus of claim 1 wherein the trolley assembly further includes vacuum heads adapted to pick up and release the parts.

3. The apparatus of claim 2 wherein the trolley assembly engages a plurality of parts with the test contactor.

4. The apparatus of claim 1 wherein the trolley assembly further comprises two trolleys slidably mounted on two drums, the trolleys housing the vacuum heads, the drums being controllably rotatable and the trolleys being controllably slidable along the drums to effectuate the orientation of the parts from input belt to the test contactor.

5. An apparatus for handling parts, the apparatus comprising:
    an input belt having at least one part;
    an output belt;
    a trolley assembly which picks up the part, rotates the part, interfaces the part with a test contactor, and subsequent to testing orients the part for placement on the output belt.

6. The apparatus of claim 5 wherein the trolley rotates the part through approximately ninety degrees to interface with the test contactor.

7. The apparatus of 1 or 5 further comprising an image forming device for forming an image of a part interfacing with the test contactor.

8. The apparatus of claim 7 wherein the image forming device includes a camera.

9. The apparatus of claim 8 further comprising an image processor adapted to receive the image from the camera, the image processor determining the interface characteristics between the part and the test contactor.

10. The apparatus of claim 9 further comprising an input belt displacement controller being coupled to the input belt, the controller controllably moving the belt based upon the image processor observations.

11. The apparatus of claim 9 further comprising a trolley assembly controller being coupled to the trolley, the controller controllably moving the trolley based upon the image processor observations.

* * * * *